(12) United States Patent
Hiramatsu et al.

(10) Patent No.: US 6,753,601 B2
(45) Date of Patent: Jun. 22, 2004

(54) CERAMIC SUBSTRATE FOR SEMICONDUCTOR FABRICATING DEVICE

(75) Inventors: Yasuji Hiramatsu, Gifu (JP); Yasutaka Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 145 days.

(21) Appl. No.: 09/926,800

(22) PCT Filed: Apr. 18, 2001

(86) PCT No.: PCT/JP01/03299

§ 371 (c)(1),
(2), (4) Date: Mar. 19, 2002

(87) PCT Pub. No.: WO01/82366

PCT Pub. Date: Nov. 1, 2001

(65) Prior Publication Data

US 2002/0158328 A1 Oct. 31, 2002

(30) Foreign Application Priority Data

Apr. 24, 2000 (JP) ........................................ 2000-121938

(51) Int. Cl.$^7$ .......................... H01L 23/06; H01L 23/10; H01L 23/15
(52) U.S. Cl. ....................... 257/703; 257/701; 361/748; 361/234
(58) Field of Search ................................ 257/701, 703, 257/705; 361/748, 234; 174/256, 258; 279/128

(56) References Cited

U.S. PATENT DOCUMENTS

| | | | | |
|---|---|---|---|---|
| 5,998,320 A | * | 12/1999 | Yamada et al. | |
| 6,080,970 A | * | 6/2000 | Yoshida et al. | |
| 6,133,557 A | * | 10/2000 | Kawanabe et al. | |
| 6,174,583 B1 | * | 1/2001 | Yamada et al. | |
| 6,370,004 B1 | * | 4/2002 | Yamaguchi | |
| 6,428,850 B1 | * | 8/2002 | Shinriki et al. | |
| 6,444,957 B1 | * | 9/2002 | Kitagawa et al. | |
| 6,465,763 B1 | | 10/2002 | Ito et al. | |
| 6,475,606 B2 | | 11/2002 | Niwa | |
| 6,507,006 B1 | | 1/2003 | Hiramatsu et al. | |

FOREIGN PATENT DOCUMENTS

| | | |
|---|---|---|
| EP | 0 929 204 A2 | 7/1999 |
| JP | 9-172057 | 6/1997 |
| JP | 9-237826 | 9/1997 |
| JP | 9-270454 | 10/1997 |
| JP | 11-204238 | 7/1999 |
| JP | 11-251040 | 9/1999 |
| JP | 11-273837 | 10/1999 |

* cited by examiner

*Primary Examiner*—Sheila V. Clark
(74) *Attorney, Agent, or Firm*—Oblon, Spivak, McClelland, Maier & Neustadt, P.C.

(57) ABSTRACT

A ceramic substrate in which even if rapid temperature rising or rapid temperature falling is conducted, no problem of cracking or warp of the ceramic substrate occurs. In a case that the ceramic substrate is a ceramic substrate constituting an electrostatic chuck, local dispersion of chuck power is eliminated, in a case that the ceramic substrate is a ceramic substrate constituting a hot plate, local dispersion of temperature of a wafer treating face is eliminated, and in a case that the ceramic substrate is a ceramic substrate constituting a wafer prober, dispersion of applied voltage of a guard electrode or a ground electrode is eliminated and a stray capacitor or noise can be eliminated. The ceramic substrate is provided with a conductor layer on the surface of the ceramic substrate or inside the ceramic substrate. A ratio ($t_2/t_1$) of the average thickness of the conductor layer ($t_2$) to the average thickness of the ceramic substrate ($t_1$) is less than 0.1, and a dispersion of the thickness of the conductor layer to the average thickness of the conductor layer is in a range of −70 to +150%.

16 Claims, 10 Drawing Sheets

CERAMIC SUBSTRATE FOR SEMICONDUCTOR FABRICATING DEVICE

TECHNICAL FIELD

The present invention relates to ceramic substrates used mainly in the semiconductor industry, and particularly to ceramic substrates suitable for hot plates, electrostatic chucks, wafer probers and so on.

BACKGROUND ART

Semiconductors are very important products necessary in various industries. Semiconductor chips are produced, for example, by slicing a silicon monocrystal into a predetermined thickness to produce a silicon wafer, and then forming a plurality of integrated circuits and the like on the silicon wafer.

In a process for manufacturing such semiconductor chips, a silicon wafer put on an electrostatic chuck is subjected to various treatments such as etching and CVD to form conductor circuits, elements and so on. At this time, a corrosive gas as a gas for deposition or a gas for etching is used. Therefore, since it is necessary to protect an electrostatic electrode layer and it is also necessary to induce adsorption power, an electrostatic electrode layer is usually covered with a ceramic dielectric film and the like.

Nitride ceramics have hitherto been used as such a ceramic dielectric film. For example, electrostatic chucks using nitrides such as aluminum nitride are disclosed in JP Kokai Hei 5-8140. Carbon-containing aluminum nitride having an Al—O—N structure is disclosed in JP Kokai Hei 9-48668.

A process for manufacturing such electrostatic chucks is disclosed in JP Kokoku Hei 6-97677 and so on.

As disclosed, for example, in JP Kokai Sho 62-264638 and JP Kokai Sho 60-261377, such electrostatic chucks made of ceramic are manufactured by the so-called green sheet method wherein a lamination is prepared by laminating green sheets and then a ceramic substrate is produced by firing the lamination.

SUMMARY OF THE INVENTION

However, it was found: that an electrostatic chuck using a ceramic produced by the above-mentioned green sheet method has the problem in dispersion of chuck power, that a ceramic heater also has the problem in dispersion of temperature on a wafer treating face; and that a wafer prober has a problem in dispersion of applied voltage of a guard electrode or a ground electrode.

The present invention has been made for solving the above-mentioned problems. The objective of the invention is to provide: a ceramic substrate generating no dispersion of chuck power in case of a ceramic substrate with an electrostatic electrode embedded inside the ceramic substrate (an electrostatic chuck); a ceramic substrate having no temperature difference among positions on its wafer treating face and also being able to evenly heat an object to be heated such as a semiconductor wafer in case of a ceramic substrate with a resistance heating element provided on the surface of the ceramic substrate or inside the ceramic substrate (a hot plate); a ceramic substrate generating no dispersion of a voltage applied to the guard electrode or the ground electrode and being able to remove stray capacitor or noise with certainty in case of a wafer prober with a guard electrode or a ground electrode provided inside the wafer prober(a ceramic substrate).

Under the above-mentioned objective, the inventors of the present invention analyzed the causes for the generation of the above-mentioned problems and have found that a formed conductor layer has dispersion of thickness and thus the dispersion of thickness causes dispersion of chuck power, dispersion of temperature on a wafer treating face and dispersion of voltage applied to electrodes.

Thus, they have finally identified the following. By the adjustment of the dispersion of thickness of the green sheets, or roughness of surface of green sheets used for the preparation of a lamination, within predetermined ranges or, in case of the formation of a conductor layer using a metal foil and the like, by making the thickness of the metal foil and the like even and the like, local dispersion of thickness dependent on portions of a conductor layer of a ceramic substrate to be produced will be reduced with a consequent result of: the elimination of local dispersion of chuck power in case of the manufacture of an electrostatic chuck; the elimination of local dispersion of temperature on a wafer treating face in the manufacture of a hot plate; and the elimination of dispersion of voltage applied to a guard electrode or a ground electrode in the manufacture of a wafer prober.

Furthermore, besides above-mentioned problem, rapid temperature rising and rapid temperature falling are required for hot plates, electrostatic chucks and wafer probers in order to quicken through put, hence, ceramic substrates have another problem, in addition to the above-mentioned problems, that they tend to crack or warp due to such rapid changes in temperature.

However, the inventors have accomplished the present invention through their finding that such a problem can be solved by adjusting the dispersion of thickness of a conductor layer or by adjusting the ratio of the thickness of a conductor layer to that of a ceramic substrate.

That is, the ceramic substrate of the present invention is a ceramic substrate provided with a conductor layer on the surface of the ceramic substrate or inside the ceramic substrate, wherein: the ratio ($t_2/t_1$) of the average thickness of the conductor layer ($t_2$) to the average thickness of the ceramic substrate ($t_1$) is less than 0.1 and; a dispersion of the thickness of the conductor layer to the average thickness of the conductor layer is in a range of −70 to +150%.

In the above-mentioned ceramic substrate, it is desirable that the ceramic substrate is in a disc-shape with a diameter exceeding 150 mm and is also desirable that the thickness of the ceramic substrate is 25 mm or less.

Moreover, in the above-mentioned ceramic substrate, it is desirable that the conductor layer is an electrostatic electrode and that the ceramic substrate functions as an electrostatic chuck.

Furthermore, in the above-mentioned ceramic substrate, it is desirable: that the above-mentioned conductor layer is a resistance heating element; and that the ceramic substrate functions as a hot plate.

Furthermore, in the above-mentioned ceramic substrate, it is desirable that the above-mentioned conductor layer is any of a chuck top electrode a guard electrode and a ground electrode and that the ceramic substrate functions as a wafer prober.

The conventional electrostatic chucks and ceramic heaters have a problem that the use of a green sheet 91 having large dispersion of thickness or having large roughness on its surface as shown in FIG. 15 results in a formation of a conductor layer whose ratio of thickness thereof to a thickness of a ceramic substrate is extremely large, therefore, warp or cracks are generated when rapid temperature increase is conducted.

Furthermore, there also are problems such that when it is used as a hot plate, big local temperature difference is generated in a wafer treating face; that, when it is used as an electrostatic chuck, dispersion of adsorbing power is generated; and that, when it is used as a wafer prober, dispersion of voltage applied is generated.

Such tendencies become particularly noticeable for those in a disc-shape with a diameter exceeding 150 mm. At the times of the filing of JP Kokai Sho 62-264638 and JP Kokai Sho 60-261377, since only those with diameters as small as about 150 mm were required in the market, dispersion of chuck power or temperature difference in a wafer treating face caused little problem.

In addition, since the green sheets used had a thicknesses of about 50 to 150 µm, no serious problem was caused even if green sheets was uneven in thickness.

In the present invention, adjustment is made so that the ratio ($t_2/t_1$) of the average thickness ($t_2$) of a conductor layer to the average thickness ($t_1$) of a ceramic substrate becomes less than 0.1; and that a dispersion of the thickness of the conductor layer to the average thickness of the conductor layer is within a range of −70 to +150%.

The dispersion itself is desirably small, but it is not possible to make the dispersion exactly zero because some dispersion will inevitably be caused due to drying of a conductor containing paste, a green sheet and the like. However, even if there is such dispersion and the dispersion does not become exactly zero, adjustment of the thickness of a conductor layer and a ceramic substrate can control the problem that warp or cracks are generated, even when rapid temperature rising is conducted.

In particular, when a ceramic substrate is used as a heater (a hot plate), the fact that the ratio ($t_2/t_1$) of the average thickness of a conductor layer ($t_2$) to the average thickness of a ceramic substrate ($t_1$) is less than 0.1 means that the ratio of the thickness of ceramic substrate to the thickness of the resistance heating element becomes large. Therefore, even if some dispersion is caused in the calorific value generated from the resistance heating element, the heat diffuses during its transmission through the inside of the ceramic substrate and thus, the temperature of the wafer treating face is becomes even. It, however, is to be noted that the thickness is desirably 25 mm or less since, when the heat capacity becomes too large, the temperature controllability becomes poor.

If the dispersion of the thickness of a resistance heating element is beyond the range of −70 to +150%, it becomes difficult to make the temperature of a wafer treating face even.

In case where a ceramic substrate is used as an electrostatic chuck, the fact that the ratio ($t_2/t_1$) of the average thickness of a conductor layer ($t_2$) to the average thickness of a ceramic substrate ($t_1$) is less than 0.1 means to make the ratio of the thickness of the electrode to the thickness of ceramic substrate small and, therefore, a leakage current at high temperatures between the adjoining conductor layers can be decreased since the area of the side face of the conductor layers becomes smaller. Also, thus, it is possible to reduce the dispersion of apparent resistance value by adjusting the dispersion of the thickness of the electrode to the average thickness of the electrode, to the range of −70 to +150%. As a result, the dispersion of chuck power at high temperature can be reduced.

Moreover, when a ceramic substrate is used as a wafer prober, the fact that the ratio ($t_2/t_1$) of the average thickness of a conductor layer ($t_2$) to the average thickness of a ceramic substrate ($t_1$) is less than 0.1 means to make the ratio of the thickness of the electrode to the thickness of ceramic substrate small and, therefore, a leakage current at high temperature between the adjoining conductor layers can be decreased because the area of the side face of the conductor layers becomes smaller.

For this reason, it is possible to reduce the dispersion of apparent resistance value by adjusting the dispersion of the thickness of the electrode to the average thickness of the electrode, to the range of −70 to +150%. As a result, the dispersion of voltage applied to a guard electrode or a ground electrode can be reduced and the generation of noise can be reduced.

The above-mentioned conductor layer desirably has a dispersion of the thickness thereof to the average thickness thereof within the range of −30 to +30%.

JP Kokai Hei 11-251040 discloses a heater having a dispersion of thickness of a resistance heating element of ±10%, but there is no description about the thickness of a ceramic substrate.

It is to be noted that: the effect that no warp or no cracks are caused is not expected in the case where the relation of the thickness of a ceramic substrate and the thickness of a resistance heating element are within a specific range as in the present invention and, therefore, the patentability of the present invention is never affected by the cited reference.

Specifically, when manufacturing a ceramic substrate using a green sheet, it is desirable that the dispersion of the thickness of the green sheet to the average thickness of the green sheet is within the range of −10 to +10%, or that a green sheet having a surface with a roughness of 200 µm or less in the value of Rmax is used. Even if the dispersion of the thickness of a green sheet to the average thickness of the green sheet is within the range of −10 to +10%, when the roughness of the surface of the green sheet exceeds 200 µm in the value of Rmax, it is desirable to adjust the roughness within 200 Mm in the value of Rmax.

When a plate-like body or a film-like body such as a metal foil is used, it is desirable that the metal foil and the like has a dispersion of its thickness to its average thickness of −10 to +10%.

The above is the description about a method for disposing a conductor layer to a ceramic substrate. However, the method for disposing a conductor layer to a ceramic substrate of the present invention is not restricted to the above-mentioned method and it is only necessary that the dispersion of the thickness of a conductor layer formed to the average thickness of the conductor is, as a result, within the range of −70 to +150%.

The above-mentioned local dispersion of chuck power of an electrostatic chuck can be judged by the measurement of the surface temperature of the adsorbed semiconductor wafer by a thermoviewer. This is because if a semiconductor wafer is adsorbed firmly to the adsorbing face of an electrostatic chuck, the temperature of the portion adsorbed firmly becomes high and, therefore, the temperature distribution of the semiconductor wafer reflects the dispersion of chuck power.

It is also possible to measure the dispersion by putting a semiconductor wafer which is partitioned into a plurality of partitions and then measuring adsorbing power of the semiconductor wafer in each partition with a load cell. In the following Examples, both of the above-mentioned methods were adopted.

The above-mentioned local dispersion of the amount of the heat generated by a resistance heating element can be judged by measuring the surface temperature of a ceramic substrate or the surface temperature of a semiconductor wafer put on a wafer treating face using a thermoviewer. This is because the local dispersion of the amount of the heat generated is also reflected to the temperature distribution of the wafer treating face.

In this case, it is recommended to dispose only a resistance heating element inside a ceramic substrate and then measure the temperature distribution of a semiconductor wafer.

Alternatively, in the case of wafer probers, the dispersion of applied voltage of a guard electrode or a ground electrode can not be measured directly. Therefore, a continuity test should be conducted using a silicon wafer that has been judged to be an acceptable product which is commercially available. In this continuity test, if this silicon wafer is judged to be an acceptable product, it should be thought that there is little dispersion.

Next, a description will be made to the structure of the ceramic substrate of the present invention and to materials constituting the ceramic substrate.

The ceramic substrate of the present invention is desirably used at 100° C. or higher, and most desirably at 200° C. or higher.

In the above-mentioned ceramic substrate, the pore diameter of the maximum pore is desirably 50 μm or less. The porosity thereof is desirably 5% or less. It is also desirable that no pores are present or, if present, the pore diameter of the maximum pore is 50 μm or less.

If no pores are present, breakdown voltage becomes especially high at high temperature. Conversely, if pores are present to some extent, fracture toughness becomes higher. Thus, which is designed depends on required properties.

The reason why fracture toughness becomes higher due to the presence of pores is unclear, but the inventors presume that the reason is based on the stop of development of cracks by the pores.

The reason why the pore diameter of the maximum pore is desirably 50 μm or less in the present invention is that if the pore diameter is over 50 μm, it is difficult to keep high breakdown voltage property at high temperature, particularly at 200° C. or higher.

The pore diameter of the maximum pore is desirably 10 μm or less. This is because the warp amount becomes small at 200° C. or higher.

The porosity and the pore diameter of the maximum pore can be adjusted by pressing time, pressure and temperature at the time of sintering, or additives such as SiC and BN. Since SiC or BN hinders sintering, pores can be produced.

When the pore diameter of the maximum pore is measured, five samples are prepared. The surfaces thereof are ground into mirror planes. With an electron microscope, ten points on the surface are photographed with 2000 to 5000 magnifications. The maximum pore diameter is selected from each of the photos obtained by the photographing, and the average of the 50 shots is defined as the pore diameter of the maximum pore.

The porosity is measured by Archimedes' method. This is a method comprising the steps of crushing a sintered product to pieces, putting the pieces into an organic solvent or mercury to measure the volume thereof, obtaining the true specific gravity of the pieces from the weight and the volume thereof, and calculating the porosity from the true specific gravity and apparent specific gravity.

The diameter of the ceramic substrate of the present invention is desirably 200 mm or more. It is especially desirable that the diameter is 12 inches (300 mm) or more.

In a large substrate having a diameter exceeding 150 mm, the thickness of an electrostatic electrode or resistance heating element is set so that the dispersion of its thickness to its average thickness is within the range of −70 to +150% as described above, otherwise the dispersion of the temperature of a heated semiconductor wafer will become big due to the dispersion of chuck power. In addition, the heat capacity of the ceramic substrate will increase, resulting in unevenness of the temperature of the wafer treating face. Conversely, in a substrate with a diameter of about 150 mm, the surface temperature becomes even, even if there is some dispersion of chuck power because the semiconductor wafer treated thereof is also small. Furthermore, even if there is some dispersion of the resistance value of a resistance heating element, the temperature of a ceramic substrate rises easily and the temperature easily becomes relatively even since the ceramic substrate has a small heat capacity.

The thickness of the above-mentioned ceramic substrate is desirably 50 mm or less, and especially desirably 25 mm or less.

This is because, if the thickness of the ceramic substrate exceeds 25 mm, the heat capacity of the ceramic substrate may be too large, and particularly when a temperature control means is set up to heat or cool the substrate, the temperature following property may become poor because of the large heat capacity.

The thickness of the ceramic substrate optimally exceeds 1.5 mm and is 5 mm or less.

In the case where the thickness of the ceramic substrate is 1.5 mm or less, if the ceramic substrate is such a large one that its diameter exceeds 150 mm, it will warp too much and, therefore, is poor in practical utility.

The ratio ($t_2/t_1$) of the thickness of the conductor layer ($t_2$) to the thickness of the ceramic substrate ($t_1$) is adjusted to be less than 0.1. The ratio is more desirably less than 0.01. This is because less ratio of the thickness of the conductor layer to the thickness of the ceramic substrate results in less occurrence of crack or warp, in less leakage current at high temperature and in less dispersion of the temperature on the wafer treating face.

The ceramic material constituting the ceramic substrate is not especially limited. Examples thereof include nitride ceramics, carbide ceramics, oxide ceramics and the like.

Examples of the nitride ceramics include metal nitride ceramics such as aluminum nitride, silicon nitride, boron nitride and the like.

Examples of the carbide ceramics include metal carbide ceramics such as silicon carbide, zirconium carbide, tantalum carbide, tungsten carbide and the like.

Examples of the oxide ceramics include metal oxide ceramics such as alumina, zirconia, cordierite, mullite, beryllia and the like.

These ceramics may be used alone or in combination of two or more thereof.

Among these ceramics, the nitride ceramics and oxide ceramics are preferred.

Aluminum nitride is most preferred among the nitride ceramics since its thermal conductivity is highest, that is, 180 W/m·K.

The ceramic substrate preferably contains 0.05 to 10% by weight of oxygen. This is because the fracture toughness can be improved by segregating oxygen in grain boundary.

This is also because if the oxygen content is less than 0.05% by weight, the sintering does not proceed, resulting in an increase in the porosity and a drop in the thermal conductivity, and contrarily, if the oxygen content exceeds 10% by weight, the thermal conductivity drops due to too much oxygen in the grain boundary, resulting in the deterioration of the temperature-rising property and the temperature-falling property.

In order to incorporate oxygen into the above-mentioned ceramic substrate, ingredient powder is fired in an oxidizing atmosphere or a metal oxide is mixed with ingredient powder and then the mixture is fired.

Examples of the metal oxide include yttria ($Y_2O_3$), alumina ($Al_2O_3$), rubidium oxide ($Rb_2O$), lithium oxide ($Li_2O$) and calcium oxide ($CaCO_3$) and the like.

The content of these metal oxides is preferably from 0.1 to 20% by weight.

In the present invention, the ceramic substrate preferably contains 5 to 5000 ppm of carbon.

This is because the ceramic substrate can be blackened by the incorporation of carbon and when the substrate is used as a heater, radiation heat can be sufficiently used.

The carbon may be either amorphous one or crystalline one. This is because the use of amorphous carbon can prevent a drop in a volume resistivity at a high temperature and the use of crystalline carbon can prevent a drop in heat conductivity at a high temperature. Accordingly, depending on the purpose, both crystalline carbon and amorphous carbon may be used together. The content of carbon is desirably 50 to 2000 ppm.

When the ceramic substrate is caused to contain carbon, the ceramic substrate is desirably caused to contain carbon so as to have a brightness of N6 or less based on the provision given in JIS Z 8721. This is because a ceramic substrate having such brightness is superior in radiation heat capacity and covering-up property.

Herein, the brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case is made to 0 or 5.

| Explanation of Symbols | |
|---|---|
| 1, 11, 63 | ceramic substrate |
| 2, 22, 32a, 32b | chuck positive electrostatic layer |
| 3, 23, 33a, 33b | chuck negative electrostatic layer |
| 2a, 3a | semicircular arc part |
| 2b, 3b | combteeth-shaped part |
| 4 | ceramic dielectric film |
| 5, 12, 25, 61 | resistance heating element |
| 6, 13, 18 | external terminal |
| 7 | metal wire |
| 8 | Peltier device |
| 9 | silicon wafer |
| 10 | ceramic heater |
| 14 | bottomed hole |
| 15 | through hole |
| 16, 17, 19 | conductor-filled through hole |
| 20, 30, 101, 201, 301, 401 | electrostatic chuck |
| 25a | metal covering layer |
| 35, 36 | blind hole |
| 41 | supporting case |
| 42 | coolant outlet |
| 43 | inhalation duct |
| 44 | coolant inlet |
| 45 | heat insulator |
| 62 | chuck top conductor layer |
| 65 | guard electrode |
| 66 | ground electrode |
| 66a | non-electrode formied area |
| 67 | groove |
| 68 | suction hole |
| 501 | wafer prober |

DETAILED DISCLOSURE OF THE INVENTION

The ceramic substrate of the present invention is a ceramic substrate provided with a conductor layer on the surface of the ceramic substrate or inside the ceramic substrate,
wherein: the ratio ($t_2/t_1$) of the average thickness of the conductor layer ($t_2$) to the average thickness of the ceramic substrate ($t_1$) is less than 0.1 and; a dispersion of the thickness of the conductor layer to the average thickness of the conductor layer is in a range of −70 to +150%.

The ceramic substrate of the present invention is a ceramic substrate used in a device for producing a semiconductor or examining a semiconductor. Examples of specific devices include an electrostatic chuck, a hot plate (a ceramic heater), a wafer prober and the like.

In case that the conductor formed inside the ceramic substrate is a resistance heating element, the ceramic substrate can be used as a ceramic heater (a hot plate).

Figure 1:
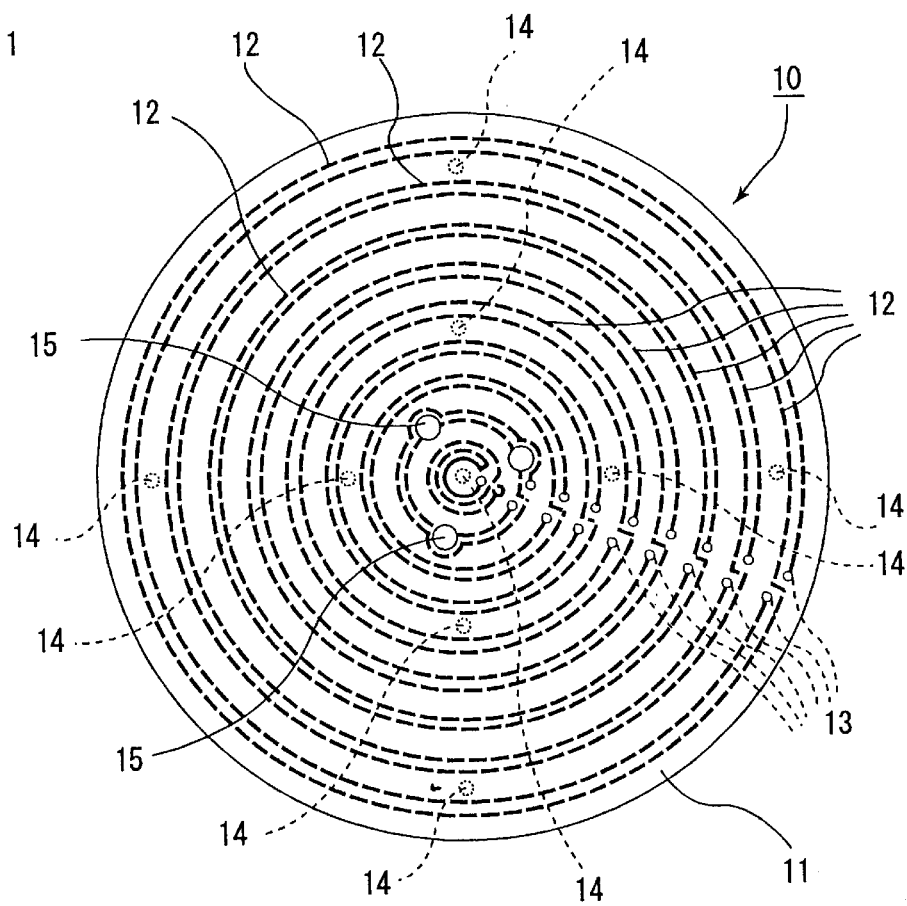
FIG. 1 is a plane view that schematically illustrates one example of a ceramic heater using a ceramic substrate of the present invention.
Figure 2:
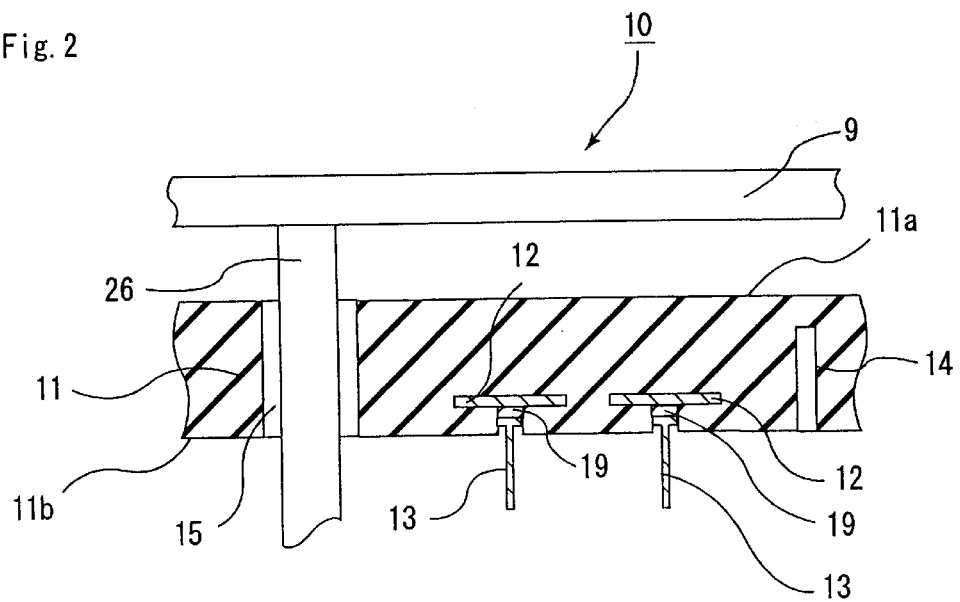
FIG. 2 is a partially enlarged sectional view of the ceramic heater illustrated in FIG. 1.

FIG. 1 is a plane view that schematically illustrates one example of a ceramic heater that is one embodiment of the ceramic substrate of the present invention. FIG. 2 is a partially enlarged sectional view illustrating a part of the ceramic heater illustrated in FIG. 1.

A ceramic substrate 11 is formed in a disc-shape. Inside the ceramic substrate 11, resistance heating elements 12 as temperature control means are formed in a pattern of concentric circles-like. About these resistance heating elements 12, two concentric circles near to each other are connected to produce one line as a circuit, and external terminals 13 that serves as inputting/outputting terminal pins are connected to both ends of the circuit through conductor-filled through holes 19.

As shown in FIG. 2, through holes 15 are formed in the ceramic substrate 11, supporting pins 26 are inserted into the through holes 15, and a silicon wafer 9 is supported therewith.

By moving the supporting pins 26 up and down, it is possible to receive the silicon wafer 9 from a carrier machine, put the silicon wafer 9 on a wafer treating face 11a of the ceramic substrate 11 and heat the silicone wafer 9, or support the silicon wafer 9 in the state that the silicon wafer 9 is a part from the wafer treating face 11a at a distance of about 50 to 2000 mm and then heat the silicon wafer 9. Bottomed holes 14 into which temperature-measuring elements such as thermocouples are inserted are formed in a bottom face 11b of the ceramic substrate 11. When electric current is passed through the resistance heating elements 12, the ceramic substrate 11 is heated so that a product to be heated, such as a silicon wafer, can be heated.

The resistance heating element may be disposed inside the ceramic substrate or may be disposed on the bottom face of the ceramic substrate. In case that the resistance heating element is set up, an inlet for blowing a coolant such as air, as cooling means may be formed in a supporting case into which the ceramic substrate is to be fitted.

In case that the resistance heating elements are disposed inside the ceramic substrate, each of the resistance heating elements may be made of a plurality of layers. In this case, the patterns of the respective layers may be formed to complement them mutually. A pattern is desirably formed on any one of the layers when being viewed from the wafer treating face. For example, a structure having a staggered arrangement is desirable.

In case that the resistance heating element is disposed on the surface of the ceramic substrate, after the production of the ceramic substrate, a conductor containing paste layer is formed on the surface of the ceramic substrate and then is fired to form a resistance heating element. In this case, the roughness of the ceramic substrate to which a conductor containing paste is applied is adjusted.

In case that the conductor formed inside the above-mentioned ceramic substrate is an electrostatic electrode layer, the ceramic substrate can be used as an electrostatic chuck. In this case, an RF electrode and resistance heating elements may be formed as conductors below the electrostatic electrode and inside the ceramic substrate.

Figure 3:
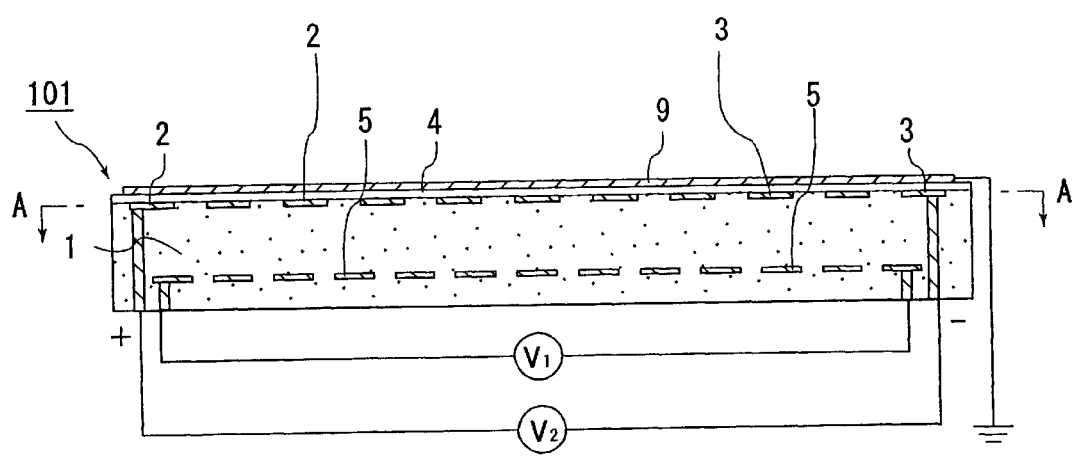
FIG. 3 is a sectional view that schematically illustrates one example of an electrostatic chuck using a ceramic substrate of the present invention.
Figure 4:
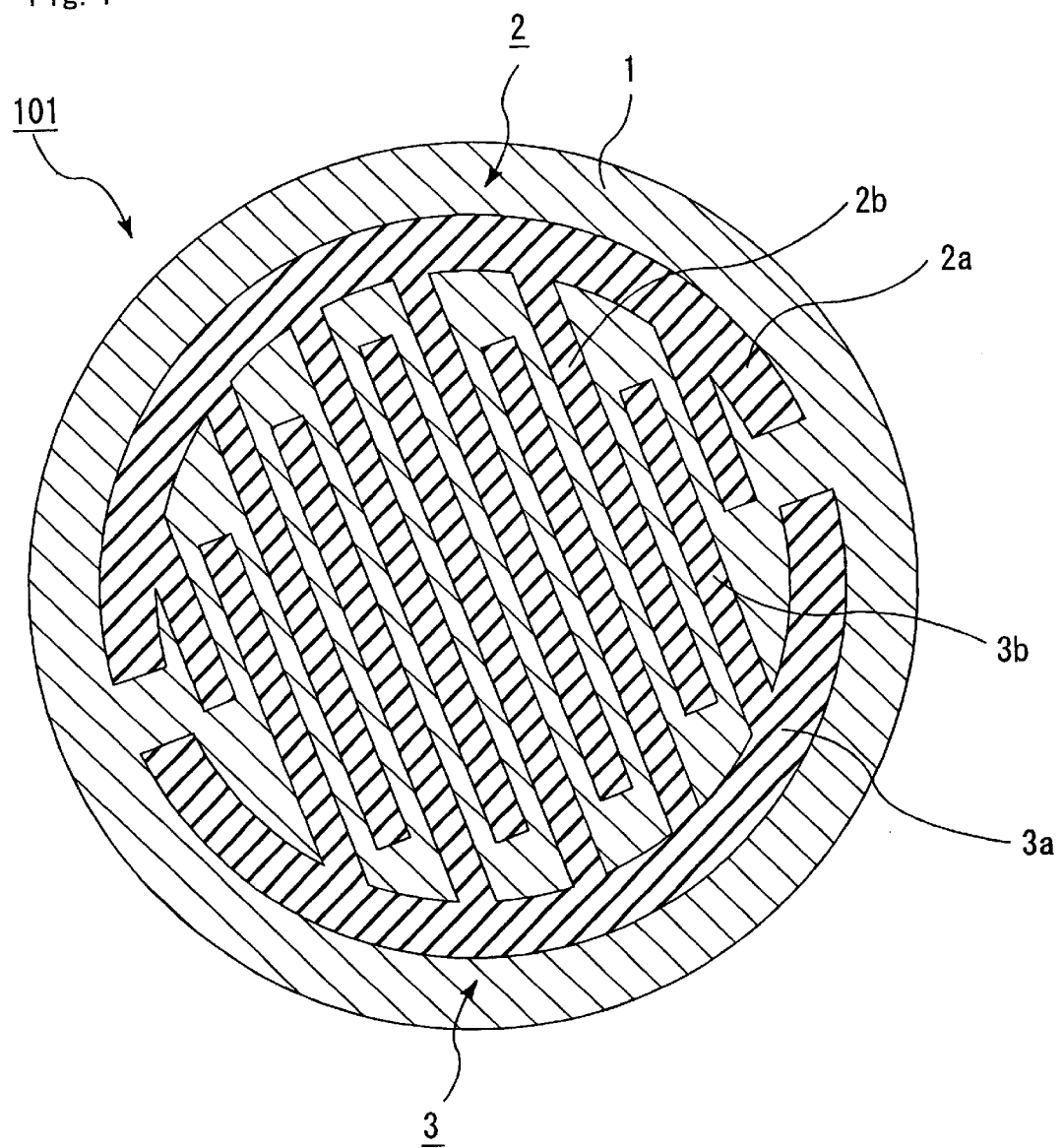
FIG. 4 is a sectional view taken along the A—A line of the ceramic heater illustrated in FIG. 3.

FIG. 3 is a vertical sectional view that schematically illustrates one embodiment of an electrostatic chuck according to the present invention. FIG. 4 is a sectional view taken along the A—A line of the electrostatic chuck illustrated in FIG. 3.

In this electrostatic chuck 101, an electrostatic electrode layer composed of a chuck positive electrostatic layer 2 and a chuck negative electrostatic layer 3 is buried in a disc-shaped ceramic substrate 1. A thin ceramic layer 4 (hereinafter, referred to as a ceramic dielectric film) is formed on the electrostatic electrode layer. The silicon wafer 9 is put on the electrostatic chuck 101 and is earthed.

As shown in FIG. 4, the chuck positive electrostatic layer 2 is composed of a semicircular arc part 2a and a combteeth-shaped part 2b. The chuck negative electrostatic layer 3 is also composed of a semicircular arc part 3a and a combteeth-shaped part 3b. These chuck positive electrostatic layer 2 and chuck negative electrostatic layer 3 are arranged by facing each other so that the combteeth-shaped parts 2b and 3b cross each other. The positive side and the negative side of a direct current power source are connected to the chuck positive electrostatic layer 2 and the chuck negative electrostatic layer 3, respectively. Thus, a direct current $V_2$ is applied thereto.

In order to control the temperature of the silicon wafer 9, resistance heating elements 5 in the form of concentric circles-like as viewed from the above, as shown in FIG. 1, are set up inside the ceramic substrate 1. External terminals are connected and fixed to both ends of the resistance heating elements 5, and a voltage $V_1$ is applied thereto. A bottomed hole into which a temperature-measuring element is inserted and a through hole through which a supporting pin (not illustrated) that supports the silicon wafer 9 and moves it up and down penetrates are formed in the ceramic substrate 1, as shown in FIGS. 1 and 2 but not shown in FIG. 3 or 4. The resistance heating elements may be formed on the bottom face of the ceramic substrate.

When this electrostatic chuck 101 is caused to work, a direct voltage $V_2$ is applied to the chuck positive electrostatic layer 2 and the chuck negative electrostatic layer 3. In this way, the silicon wafer 9 is adsorbed and fixed onto the chuck positive electrostatic layer 2 and the chuck negative electrostatic layer 3 through the ceramic dielectric film 4 by electrostatic action of these electrodes. The silicon wafer 9 is fixed onto the electrostatic chuck 101 in this way, and subsequently the silicon wafer 9 is subjected to various treatments such as CVD.

In the electrostatic chuck 101, the ceramic dielectric film 4 comprises a nitride ceramic containing oxygen, and desirably has a porosity of 5% or less and a maximum pore diameter of 5 $\mu$m or less. The pores in this ceramic dielectric film 4 are desirably comprising pores independent of each other.

Besides the resistance heating elements 12, a Peltier device (reference to FIG. 7) is mentioned as the temperature control means.

In case that the Peltier device is used as the temperature control means, both heating and cooling can be attained by changing the direction along which an electric current passes. Thus, this case is advantageous.

Figure 7:
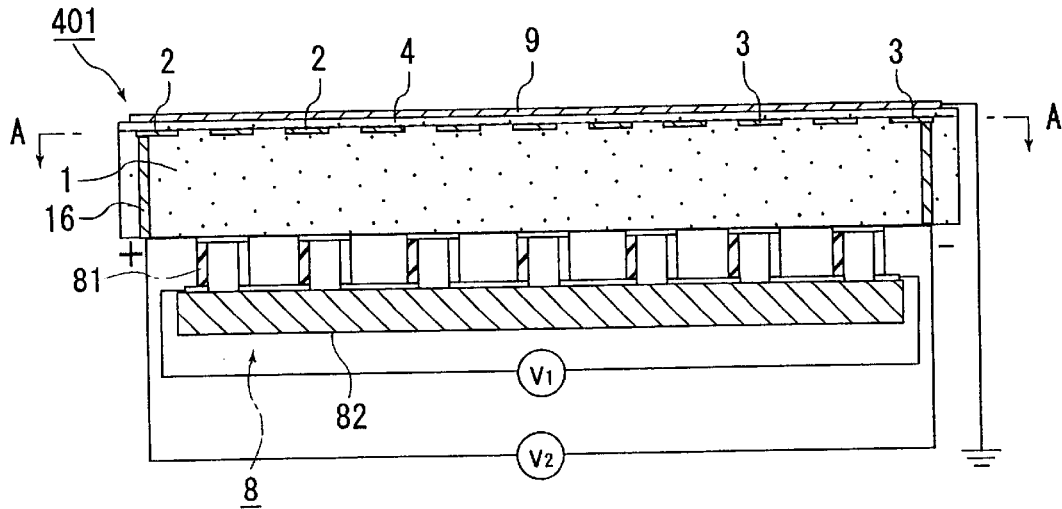
FIG. 7 is a sectional view that schematically illustrates one example of an electrostatic chuck using a ceramic substrate of the present invention.

As shown in FIG. 7, the Peltier device 8 is formed by connecting p type and n type thermoelectric elements 81 in series and then jointing the resultant to a ceramic plate 82 and the like.

Examples of the Peltier device include silicon/germanium, bismuth/antimony, lead/tellurium materials and the like.

The electrostatic chuck of the present invention has a structure as shown in, for example, FIGS. 3 and 4. The raw materials of the ceramic substrate and so on have already been described. The following will describe, in sequence and in detail, other respective members constituting the above-mentioned electrostatic chuck and other embodiments of the electrostatic chuck of the present invention.

The ceramic dielectric film used in the electrostatic chuck according to the present invention desirably comprises nitride ceramic.

Examples of the nitride ceramic include materials the same as those of the above-mentioned ceramic substrate. The nitride ceramic desirably contains oxygen. In this case, the sintering of the nitride ceramic advances easily. In case that the nitride ceramic substrate contains pores, the pores become independent pores so that the breakdown voltage is improved.

In order to incorporate oxygen into the above-mentioned nitride ceramic, a metal oxide is usually mixed with ingredient powder of the nitride ceramic, and then the mixture is sintered.

Examples of the metal oxide include alumina ($Al_2O_3$) silicon oxide ($SiO_2$) and the like.

The addition amount of such a metal oxide is preferably from 0.1 to 10 parts by weight per 100 parts by weight of the nitride ceramic.

By setting the thickness of the ceramic dielectric film to 50 to 5000 $\mu$m, sufficient breakdown voltage can be secured without the drop of the chuck power.

If the thickness of the ceramic dielectric film is less than 50 $\mu$m, the thickness is too thin to obtain sufficient breakdown voltage. Thus, when a silicon wafer is put and is adsorbed thereon, the ceramic dielectric film may undergo dielectric breakdown. On the other hand, if the thickness of the ceramic dielectric film exceeds 5000 $\mu$m, the distance between the silicon wafer and the electrostatic electrodes becomes large so that the capability of adsorbing the silicon wafer drops. The thickness of the ceramic dielectric film is preferably from 100 to 1500 $\mu$m.

It is preferable that the porosity of the ceramic dielectric film is 5% or less and the pore diameter of maximum pores is 50 $\mu$m or less.

If the porosity exceeds 5%, the number of the pores increases and the diameter of the pores becomes too large so that the pores are easily interconnected with each other. In ceramic dielectric films having such a structure, their breakdown voltage drops.

When the pore diameter of the maximum pores exceeds 50 $\mu$m, breakdown voltage can not be secured at high temperature and it is difficult to make the thermal conductivity high even if the number of the pores is reduced. The porosity is preferably from 0.01 to 3%. The diameter of the maximum pores is preferably from 0.1 to 10 $\mu$m.

The ceramic dielectric film desirably contains 50 to 5000 ppm of carbon. This is because the ceramic dielectric film can hide the electrode pattern arranged in the electrostatic chuck and a high radiation heat can be obtained. As the volume resistivity is lower, the power of absorbing the silicon wafer becomes higher at low temperatures.

The reason why pores may be present to some extent in the ceramic dielectric film in the present invention is that fracture toughness can be made high. In this way, thermal shock resistance can be improved.

Examples of the above-mentioned electrostatic electrode include sintered bodies made of metal or conductive ceramic and metal foils. As the metal sintered bodies, those made of at least one selected from tungsten and molybdenum are preferable. The metal foils are preferably made of materials the same as those of the metal sintered bodies. This is because these metals are relatively resistant to oxidation and have sufficient conductivity for electrodes. As the conductive ceramic, at least one selected from carbides of tungsten and molybdenum can be used.

Figure 9:
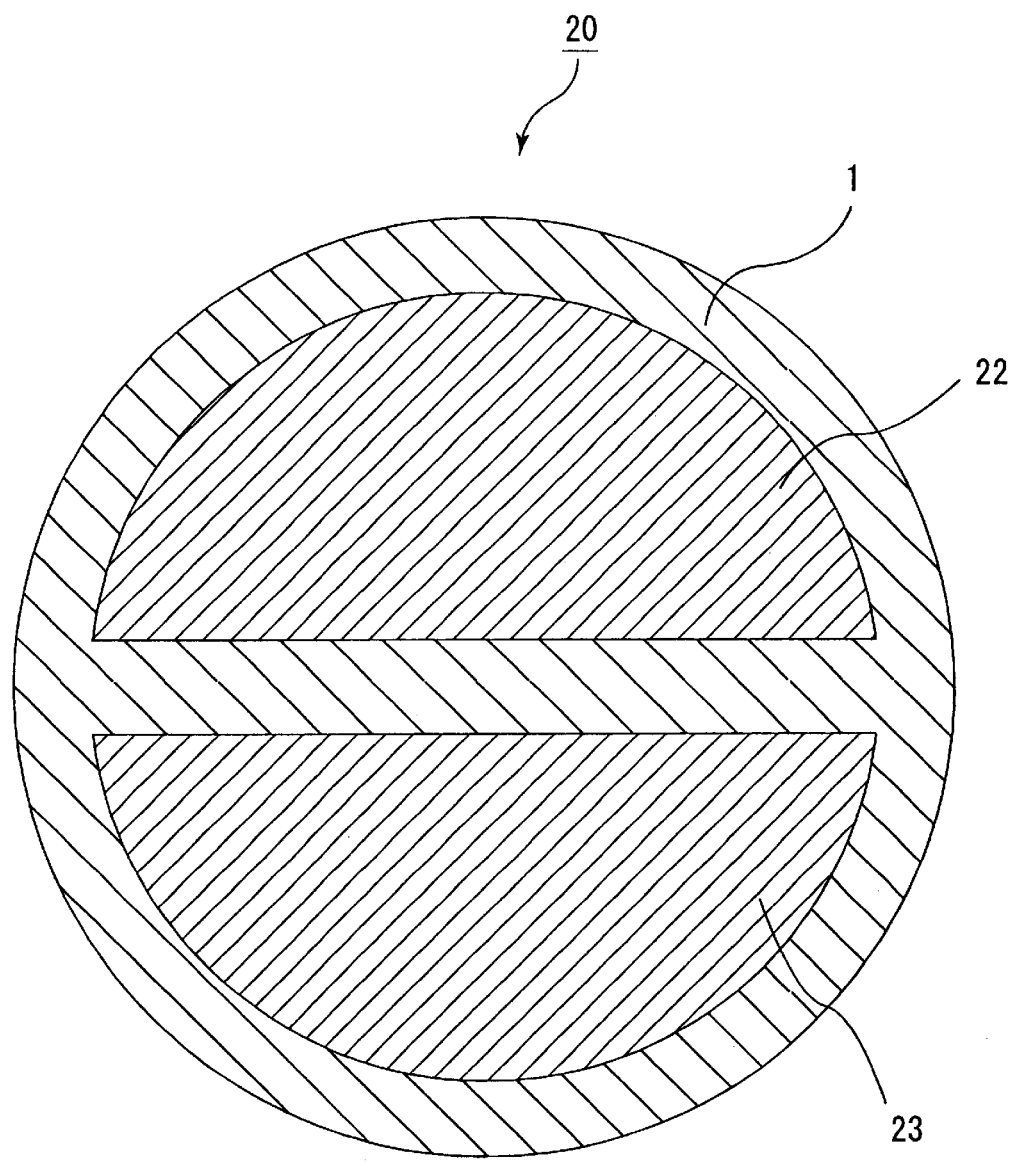
FIG. 9 is a horizontal sectional view that schematically illustrates the shape of an electrostatic electrode constituting an electrostatic chuck according to the present invention.
Figure 10:
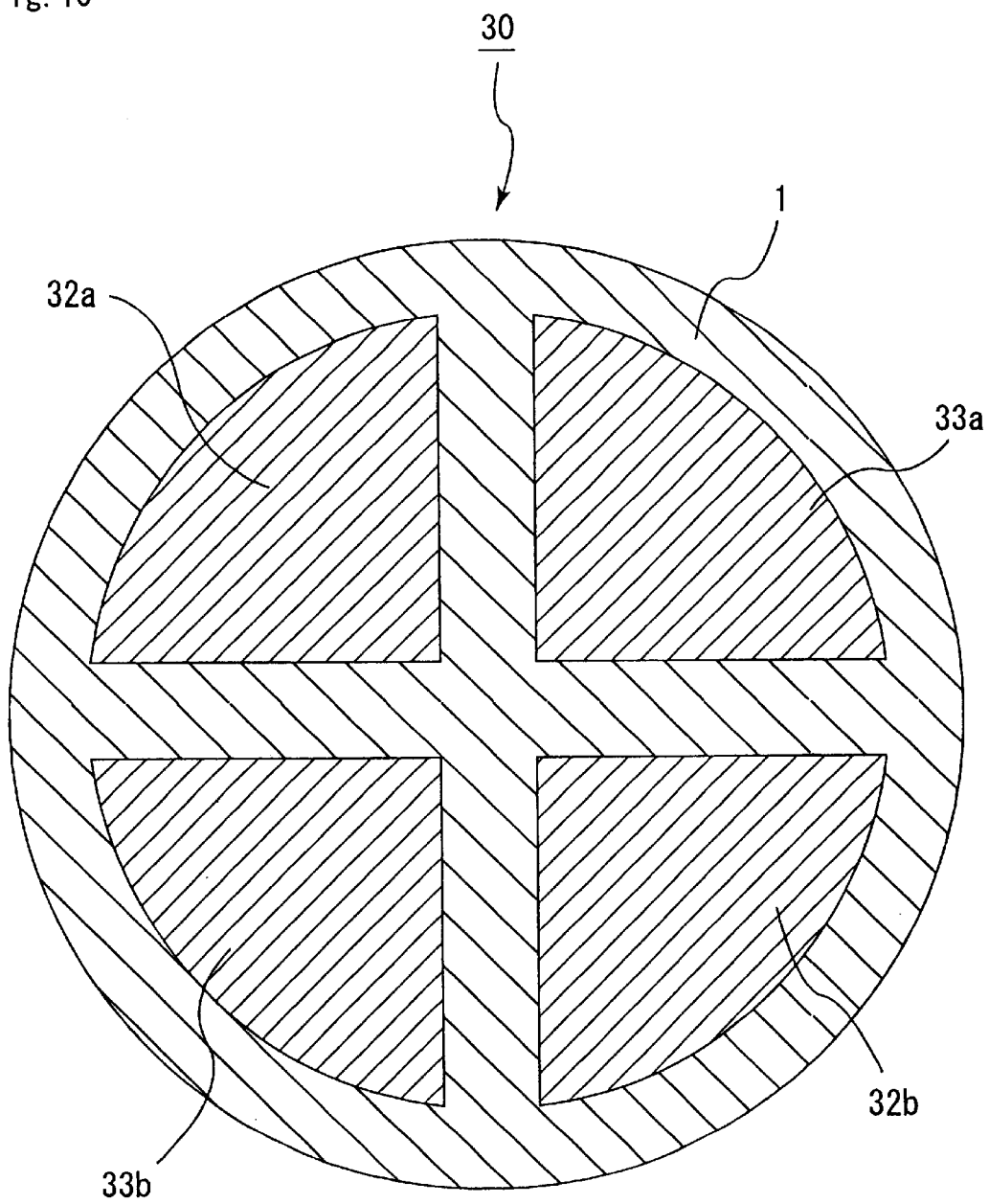
FIG. 10 is a horizontal sectional view that schematically illustrates the shape of an electrostatic electrode constituting an electrostatic chuck according to the present invention.

FIGS. 9 and 10 are horizontal sectional views, each of which schematically shows an electrostatic electrode in other electrostatic chuck. In the electrostatic chuck 20 shown in FIG. 9, a chuck positive electrostatic layer 22 and a chuck negative electrostatic layer 23, both in a semicircular form, are formed inside a ceramic substrate 1. In the electrostatic chuck shown in FIG. 10, chuck positive electrostatic layers 32a and 32b and chuck negative electrostatic layers 33a and 33b, each of which has a shape obtained by dividing a circle into four parts, are formed inside a ceramic substrate 1. The two chuck positive electrostatic layers 22a and 22b and the two chuck negative electrostatic layers 33a and 33b are formed to cross.

In case that an electrode having a form that an electrode in the shape of a circle and the like is divided is formed, the number of the divided parts is not particularly limited and may be five or more. Its shape is not limited to a sector, either.

Figure 5:
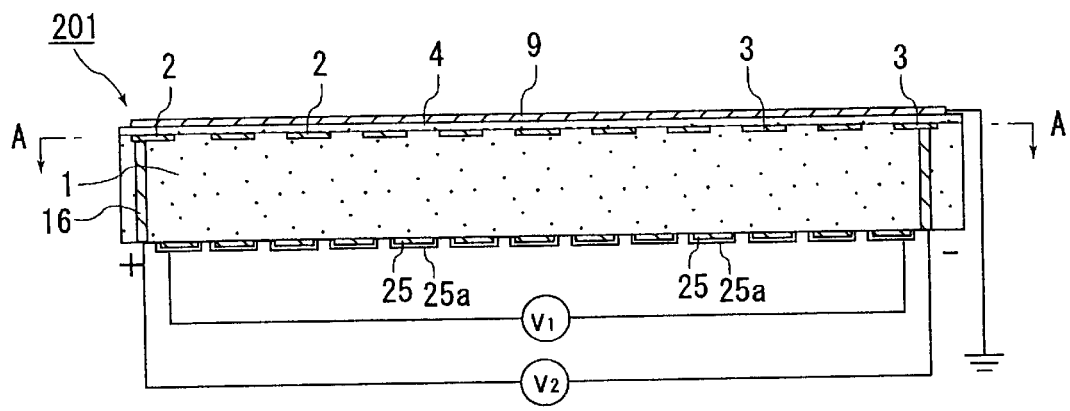
FIG. 5 is a sectional view that schematically illustrates one example of an electrostatic chuck using a ceramic substrate of the present invention.
Figure 6:
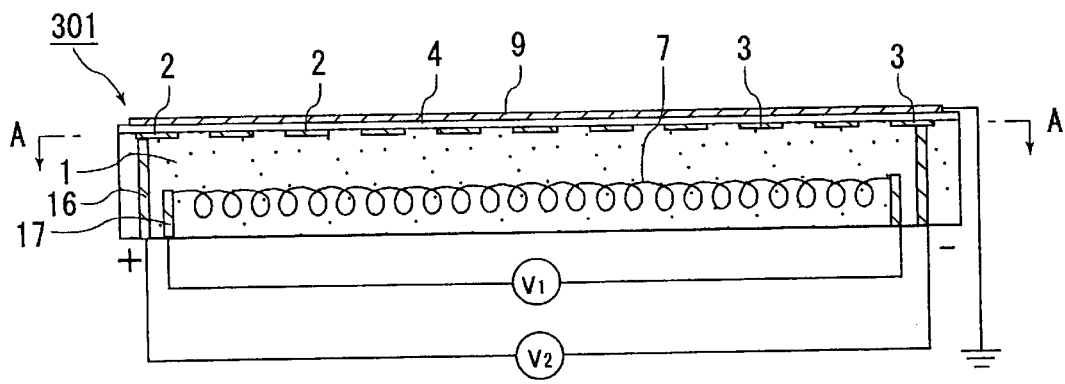
FIG. 6 is a sectional view that schematically illustrates one example of an electrostatic chuck using a ceramic substrate of the present invention.

Examples of the electrostatic chuck in the present invention include an electrostatic chuck 101 having a structure wherein a chuck positive electrostatic layer 2 and a chuck negative electrostatic layer 3 are arranged between a ceramic substrate 1 and a ceramic dielectric film 4 and resistance heating elements 5 are set up inside the ceramic substrate 1, as shown in FIG. 3; an electrostatic chuck 201 having a structure wherein a chuck positive electrostatic layer 2 and a chuck negative electrostatic layer 3 are arranged between a ceramic substrate 1 and a ceramic dielectric film 4 and resistance heating elements 25 are disposed on the bottom face of the ceramic substrate 1, as shown in FIG. 5; an electrostatic chuck 301 having a structure wherein a chuck positive electrostatic layer 2 and a chuck negative electrostatic layer 3 are arranged between a ceramic substrate 1 and a ceramic dielectric film 4 and a metal wire 7, which is a resistance heating element, is buried in the ceramic substrate 1, as shown in FIG. 6; and an electrostatic chuck 401 having a structure wherein a chuck positive electrostatic layer 2 and a chuck negative electrostatic layer 3 are arranged between a ceramic substrate 1 and a ceramic dielectric film 4 and a Peltier device 8 comprising a thermoelectric element 81 and a ceramic plate 82 is formed on the bottom face of the ceramic substrate 1, as shown in FIG. 7.

As shown in FIGS. 3 through 7, in the present invention, a chuck positive electrostatic layer 2 and a chuck negative electrostatic layer 3 are arranged between a ceramic substrate 1 and a ceramic dielectric film 4 and resistance heating elements 5 or a metal wire 7 is formed inside the ceramic substrate 1. Therefore, connecting units (conductor-filled through holes) 16, 17 are necessary for connecting these units to external terminals. The conductor-filled through holes 16, 17 are formed by filling with a high melting point metal such as a tungsten paste and a molybdenum paste, or a conductive ceramic such as tungsten carbide and molybdenum carbide.

The diameter of the connecting units (conductor-filled through holes) 16, 17 is desirably from 0.1 to 10 mm. This is because disconnection can be prevented and further cracks or strains can be prevented.

External terminals 6, 18 are connected using the conductor-filled through holes as connecting pads (reference to FIG. 8(d)).

The connecting thereof is performed with a solder or brazing-filler. As the brazing-filler, brazing silver, brazing palladium, brazing aluminum, or brazing gold is used. As the brazing gold, Au—Ni alloy is desirable because Au—Ni alloy is superior in adhesiveness to tungsten.

The ratio of Au/Ni is desirably [81.5 to 82.5 (% by weight)]/[18.5 to 17.5 (% by weight)].

The thickness of the Au—Ni layer is desirably from 0.1 to 50 $\mu$m. This is because this range is a range sufficient for securing connection. If Au—Cu alloy is used at a high temperature of 500 to 1000° C. and at a high vacuum of $10^{-6}$ to $10^{-5}$ Pa, the Au—Cu alloy deteriorates. However, Au—Ni alloy does not cause such deterioration and is profitable. The amount of impurities in the Au—Ni alloy is desirably less than 1 part by weight when the total amount of the Au—Ni alloy is regarded as 100 parts by weight.

If necessary, in the present invention, a thermocouple may be buried in the bottomed hole in the ceramic substrate. This is because the thermocouple makes it possible to measure the temperature of the resistance heating element and, on the basis of the resultant data, voltage or electric current is changed so that the temperature can be controlled.

The size of the connecting portions of metal wires of the thermocouples is the same as or larger than the strand diameter of the respective metal wires, and is preferably 0.5 mm or less. Such a structure reduces the heat capacity of the connecting portion and causes a temperature to be correctly and rapidly converted to a current value. For this reason, the temperature controllability is improved so that the temperature distribution of the wafer treating face of the wafer is reduced.

Examples of the above-mentioned thermocouple include K, R, B, S, E, J and T type thermocouples, described in JIS-C-1602 (1980).

Figure 11:
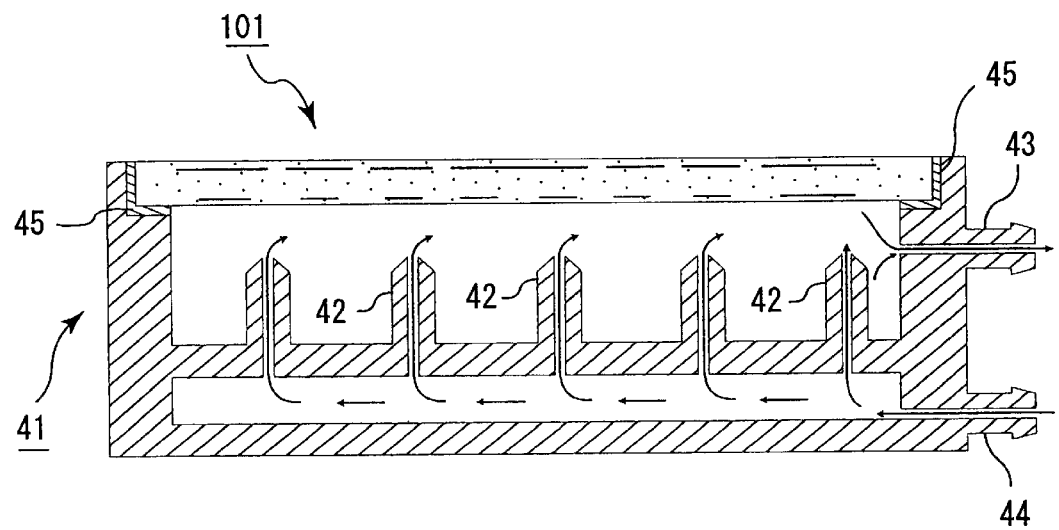
FIG. 11 is a sectional view that schematically illustrates the state that an electrostatic chuck according to the present invention is fitted into a supporting case.

FIG. 11 is a sectional view that schematically illustrates a supporting case 41 into which an electrostatic chuck of the present invention having a structure described above is fitted.

The supporting case 41 is designed so that an electrostatic chuck 101 is fitted therein through a heat insulator 45. Coolant outlets 42 are formed in the supporting case 11, and a coolant is blown from a coolant inlet 44 and passes outside from an inhalation duct 43 through the coolant outlet 42. By the action of this coolant, the electrostatic chuck 101 can be cooled.

Next, the process for producing the ceramic substrate of the present invention will be described by taking a process for producing an electrostatic chuck as an example. A process for producing a ceramic substrate having a resistance heating element will be described later.

FIGS. 8(a) to (d) are sectional views schematically illustrating one example of the process for producing a ceramic substrate constituting an electrostatic chuck.

(1) In the present invention, it is desirable to prepare first a green sheet 50 in which the dispersion of the thickness to the average thickness is in the range of –10 to +10% or the roughness of the surface is 200 μm or less in the value of Rmax by mixing ingredient powder for ceramic such as nitride ceramic and carbide ceramic with a binder and a solvent first. As for a green sheet in which the dispersion of the thickness to the average thickness is in the range of –10 to +10% but the roughness of the surface exceeds 200 μm in the value of Rmax, the roughness of the surface is desirebly made 200 μm or less in the value of Rmax.

The reason why the green sheet is caused to have the above-mentioned shape is as follows: If there are remarkable irregularities on the surface of a green sheet, irregularity of the thickness of the conductor containing paste will be formed in a portion where the conductor containing paste will come into contact with the green sheet. This causes local dispersion of thickness of the conductor containing paste. This may result in the dispersion of the thickness of an electrostatic electrode layer of the electrostatic chuck to be produced to the average thickness of the electrostatic electrode layer thereof exceeding the range of –70 to +150%, leading to the dispersion of chuck power.

The ceramic ingredient powder may, for example, be aluminum nitride powder on which surface an oxide layer has been formed by firing in an oxidizable atmosphere.

If necessary, sintering aids such as yttria, alumina, silica and sulfur compounds or catalysts may be added. The average particle diameter of the ingredient powder is preferably from 0.1 to 5 μm.

The simplest approach to adjust the dispersion of the thickness of a green sheet or the surface roughness of the green sheet is selection of drying conditions. In case that the green sheet has a viscosity of $1 \times 10^4$ to $4 \times 10^4$ cp (10 to 40 Pa·s), the dispersion of the thickness of the green sheet can be adjusted within the range of –10 to +10% and the surface roughness in the value of Rmax of the green sheet can be made 200 μm or less by drying a green sheet under the conditions: at 50 to 200° C. for 10 to 60 minutes and the initial drying temperature being lower than 150° C. Particularly, when drying at high temperatures, the surface becomes rough because of rapid volatilization of the internal solvent and the like. When drying at low temperatures, the surface becomes smooth. JP Kokai Hei 12-21961 discloses a manufacturing process of an electrostatic chuck by the green sheet method, but there is no description on the value of the viscosity the green sheet to be dried. Therefore, the patentability of the present invention is never affected by such a publication.

Several or one green sheet(s) 50' laminated on the green sheet on which an electrostatic electrode layer printed element 51 is formed are/is a layer which will become a ceramic dielectric film 4; therefore, the sheet 50' may, if necessary, have a composition different from that of the ceramic substrate.

Usually, the raw material of the ceramic dielectric film 4 and that of the ceramic substrate 1 are desirably the same. This is because these are sintered under the same condition since these are sintered together in many cases. In case that the raw materials are different, it is allowable that a ceramic substrate is produced first, a conductor containing paste layer that will become an electrostatic electrode layer is formed thereon, and then a green sheet that will become a ceramic dielectric film is laminated thereon and is fired.

Desirable as the binder is at least one selected from acrylic binders, ethyl cellulose, butylcellosolve, polyvinyl alcohol and the like.

Desirable as the solvent is at least one selected from α-terpineol, glycol and the like.

A paste obtained by mixing these ingredients is formed into a sheet form by a forming process such as the doctor blade process. Thus, a green sheet 50 is obtained. The viscosity of the green sheet before drying is preferably $1 \times 10^4$ to $4 \times 10^4$ cP. This is because by setting the green sheet to such a viscosity range, the dispersion of thickness and the degree of the surface roughness of the green sheet can be reduced to be within the above-mentioned ranges.

If the viscosity of the green sheet is less than $1 \times 10^4$ cP, the fluidity becomes too large, resulting in the difficulty in maintaining the shape of the green sheet. On the other hand, if the viscosity of the green sheet exceeds $4 \times 10^4$ cP, it is difficult to adjust the green sheet to an even thickness or a roughness equal to or less than a predetermined value using a blade and the like.

If necessary, next, a through hole into which a supporting pin of a silicon wafer is inserted, a concave portion in which a thermocouple is buried or a through hole provided in a portion where a conductor-filled through hole and the like is to be formed may be formed in the green sheet 50. The through hole can be formed by punching and the like.

These through hole, concave portion and the like may be formed after the formation of a lamination of green sheets or may be formed with a drill and the like after the formation of a sintered body.

The average of the thickness of the green sheet 50 is preferably from about 0.1 to 5 mm.

Next, a conductor containing paste is filled up into the through holes in the green sheet 50 to obtain a conductor-filled through hole printed elements 53, 54. Next, a conductor containing paste that will become an electrostatic electrode layer or a resistance heating element is printed on the green sheet 50.

The printing is performed so that a desired aspect ratio is obtained in consideration of the shrinkage ratio of the green sheet 50. In this way, a electrostatic electrode layer printed element 51 and a resistance heating element layer printed element 52 are prepared.

The printed element is formed by printing a conductor containing paste that contains conductive ceramic, metal particles and so on. Examples of the shape of an electrostatic electrode include the shapes illustrated in FIGS. 4, 9, 10 and the like.

What is the most suitable as the conductive ceramic particles contained in the conductor containing paste is carbide of tungsten or molybdenum. This is because they are not easily oxidized and their thermal conductivity does not easily drop.

As the metal particles, for example, tungsten, molybdenum, platinum, nickel and the like can be used.

The average particle diameters of the conductive ceramic particles and the metal particles are preferably from 0.1 to 5 $\mu$m. This is because the conductor containing paste is not easily printed in either case that these particles are too large or too small.

What is the most suitable as such a paste is a conductor containing paste prepared by mixing 85 to 97 parts by weight of metal particles or conductive ceramic particles; 1.5 to 10 parts by weight of at least one binder selected from acrylic binders, ethyl cellulose, butylcellosolve and polyvinyl alcohol; 1.5 to 10 parts by weight of at least one solvent selected from α-terpineol, glycol, ethyl alcohol and butanol. In this case, the viscosity of the conductor containing paste to be prepared is preferably $5\times10^4$ to $50\times10^4$ cP (50 to 500 Pa·s).

Figure 8:
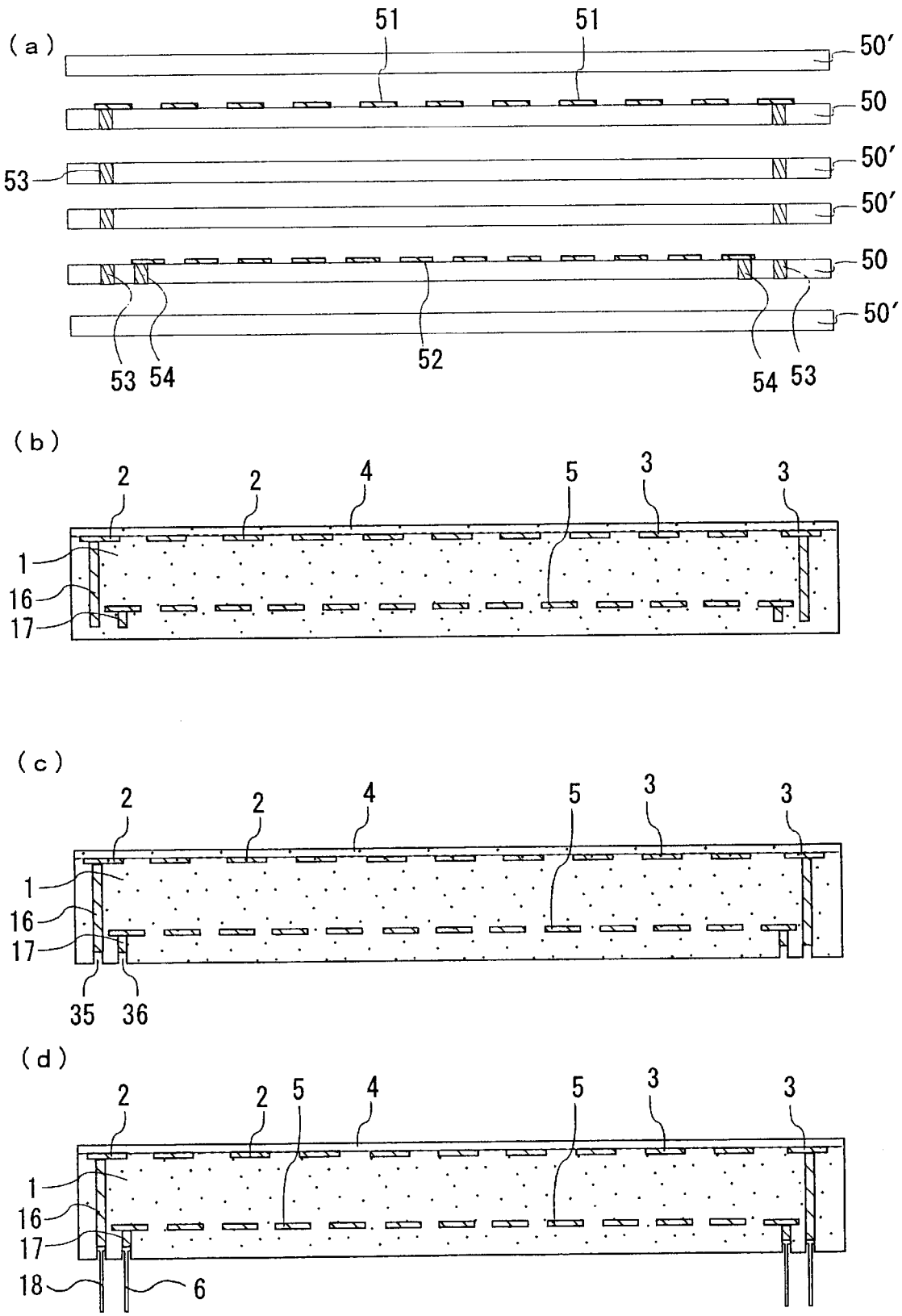
FIGS. 8(a) to (d) are sectional views that schematically illustrate a part of the process for producing the electrostatic chuck illustrated in FIG. 5.

As shown in FIG. 8(*a*), the green sheet 50 having the printed elements 51, 52, 53 and 54 and the green sheet 50' having no printed elements are laminated. The purpose of the laminating of the green sheet 50' having no printed elements in the lower face of the side where resistance heating elements are to be formed is to prevent the end faces of the conductor-filled through holes from being exposed to be oxidized at the time of the firing for the formation of resistance heating elements. If the firing for the formation of the resistance heating elements is performed in the state that the end faces of the conductor-filled through holes are exposed, it is necessary to sputter a metal that is not easily oxidized such as nickel. Alternatively, the end faces may be covered with brazing gold comprising Au—Ni alloy.

(2) Next, as shown in FIG. 8(*b*), the lamination is heated and pressed to form a lamination of the green sheets. The heating temperature of the lamination is preferably from 50 to 300° C. and the pressure upon the pressing is preferably from 2 to 20 MPa (20 to 200 kg/cm²).

Thereafter, the green sheets and the conductor containing paste are sintered. The temperature at the time of the firing is preferably from 1000 to 2000° C. and the pressure at the time of the firing is preferably from 10 to 20 MPa (100 to 200 kg/cm²). The heating and the pressing are performed in the atmosphere of inert gas. As the inert gas, argon, nitrogen and the like can be used. In this firing step, conductor-filled through holes 16, 17, a chuck positive electrostatic layer 2, a chuck negative electrostatic layer 3, a resistance heating elements 5 and so on are formed.

After producing a ceramic substrate in the above-mentioned process, it is also allowable to subject it to annealing treatment at 1400 to 2000° C. By this operation, impurities such as oxygen contained in crystal particles are removed outside the crystals, leading to the improvement in thermal conductivity.

(3) Next, as shown in FIG. 8(*c*), blind holes 35, 36 for connecting external terminals are formed.

It is desirable that at least a part of the inside walls of the blind holes 35, 36 is made conductive and that the conductive part of the inside walls is connected to the chuck positive electrostatic layer 2, the chuck negative electrostatic layer 3, the resistance heating elements 5 and so on.

(4) At last, as shown in FIG. 8(*d*), external terminals 6, 18 are fitted into the blind holes 35, 36 through a brazing gold. If necessary, a bottomed hole may be formed and a thermocouple may be buried therein.

As a solder, an alloy such as silver-lead, lead-tin and bismuth-tin can be used. The thickness of the solder layer is desirably from 0.1 to 50 $\mu$m. This is because this is a range sufficient for securing the connection with a solder.

By passing such a manufacturing process, an electrostatic chuck having a structure shown in FIGS. 3 and 4, for example, can be obtained. Since the electrostatic electrode layer of the resulting electrostatic chuck has no dispersion of thickness, the electrostatic chuck becomes one having even chuck power throughout the electrostatic electrode layer.

In the above-described method for producing an electrostatic chuck, the electrostatic chuck 101 (reference to FIGS. 3 and 4) was taken as an example. In case that the electrostatic chuck 201 (reference to FIG. 5) is produced, it is advisable to produce a ceramic substrate having an electrostatic electrode layer first, print a conductor containing paste on the bottom face of this ceramic substrate, fire the resultant to form a resistance heating elements 25, and then form a metal covering layer 25a by electroless plating and the like. In case that the electrostatic chuck 301 (reference to FIG. 6) is produced, it is advisable to produce the electrostatic chuck almost in the same manner as in the case of the electrostatic chuck 101 except for placing a metal wire on a green sheet in stead of forming a conductor containing paste layer that will become a resistance heating element.

In case that the electrostatic chuck 401 (reference to FIG. 7) is produced, it is advisable to produce a ceramic substrate having an electrostatic electrode layer and then joint a Peltier device to the ceramic substrate through a metallized metal layer.

Next, a description will be made to a process for producing a ceramic heater that is one example of the ceramic substrate of the present invention.

In the process for producing the above-mentioned ceramic heater, a ceramic heater having a resistance heating element therein is produced almost in the same manner as the method for producing the above-mentioned electrostatic chuck except for printing a conductor containing paste for forming a resistance heating element on the surface of a green sheet. Therefore, only a description on a method for forming the resistance heating element will be made here.

The resistance heating element is desirably made of a metal such as a noble metal (gold, silver, platinum and palladium), tungsten, molybdenum, nickel and the like; and a conductive ceramics such as carbide of tungsten or molybdenum and the like. This is because these materials can make the resistance value high and make the thickness itself large to prevent disconnection and the like, and are not easily oxidized and thermal conductivity thereof is not easily reduced. These may be used alone or in combination of two or more.

Since it is necessary for a resistance heating element to make the temperature of the whole ceramic substrate even, the resistance heating element preferably has a pattern of concentric circles-like shown in FIG. 1 or a combination of a pattern of concentric circles-like and that of bending lines. Furthermore, it is desirable that the width or thickness of the conductor containing paste layer is set so that the resistance heating element in the resulting ceramic heater has a thickness of 1 to 50 μm and a width of 5 to 20 mm.

This is because the above-mentioned ranges are most practical though the resistance value of the resistance heating element can be changed by changing its thickness or width. As the resistance heating element becomes thinner or narrower, the ohmic resistance value of the resistance heating element becomes larger.

If the resistance heating element is set inside, the distance between a wafer treating face and the resistance heating element becomes close so that evenness of the temperature of the surface becomes poor. Thus, it is necessary to widen the resistance heating element itself. Since the resistance heating element is set inside the ceramic substrate, it becomes unnecessary to consider adhesiveness of this element to the ceramic substrate.

The section of resistance heating element may be in a rectanglar, an elliptic, a spindle-like and a semicircular, but is desirably flat. This is because since a flat one easily radiates heat toward the wafer treating face, a large calorific value can be transmitted to the wafer treating face and a temperature distribution in the wafer treating face is not easily generated. The shape of the resistance heating element may be spiral.

When resistance heating elements are formed inside the ceramic substrate, they are desirably formed within the region extending from the bottom face of the ceramic substrate up to 60% in the direction of the thickness thereof. This is because the temperature distribution in the wafer treating face is eliminated so that a semiconductor wafer can be evenly heated.

In a process for producing the above-mentioned ceramic heater, a resistance heating element is formed inside a ceramic substrate or a resistance heating element is formed on the bottom face of a ceramic substrate. In a process for producing the above-mentioned electrostatic chuck, it is also allowable that a resistance heating element is formed on the bottom face of a ceramic substrate. Therefore, a description will be made hereafter also to the case where a resistance heating element is formed on the bottom face of a ceramic substrate.

In case that resistance heating elements are formed on the bottom face of a ceramic substrate, the resistance heating elements are usually formed by performing firing to produce the ceramic substrate and then forming the above-mentioned conductor containing paste on the surface of the ceramic substrate, followed by firing.

The conductor containing paste to be used in the formation of a conductor containing paste layer on the bottom face of the ceramic substrate after the firing, or to be used in the formation of a conductor containing paste layer on the surface of a green sheet is not particularly restricted, but is preferably a composition containing not only metal particles or conductive ceramic particles for securing electrical conductivity but also a resin, a solvent, a thickener and so on.

Examples of the materials of the metal particles and conductive ceramic particles mentioned above include those mentioned previously. The particle diameter of these metal particles or the conductive ceramic is preferably 0.1 to 100 μm. If the particle diameter is too fine, that is, below 0.1 μm, they are easily oxidized. On the other hand, if the particle diameter is over 100 μm, they are not easily sintered so that the resistance value becomes large.

The shape of the metal particles mentioned above may be spherical or scaly. When these metal particles are used, they may be a mixture of spherical particles and scaly particles mentioned above. It is to be noted that scaly particles have a smaller dispersion of thickness.

In case that the metal particles are scaly particles or a mixture of spherical particles and scaly particles mentioned above, metal oxides between the metal particles are easily retained and adhesiveness between the resistance heating elements and the ceramic substrate is made sure. Moreover, the resistance value can be made large. Thus, this case is profitable.

Examples of the resin used in the above-mentioned conductor containing paste include acrylic resins, epoxy resins, phenol resins and the like. Examples of the solvent are isopropyl alcohol and the like. Examples of the thickener are cellulose and the like. In case that the resistance heating element is set inside the ceramic substrate, the conductor containing paste preferably have a viscosity of $5 \times 10^4$ to $50 \times 10^4$ cP (from 50 to 500 Pa·s).

When the conductor containing paste for the resistance heating element is formed on the surface of the ceramic substrate, it is desired to add a metal oxide as well as the metal particles mentioned above to the conductor containing paste and make the resistance heating element into a sintered body of the metal particles and the metal oxide mentioned above. By sintering the metal oxide together with the metal particles in this way, the ceramic substrate can be firmly adhered to the metal particles.

The reason why the mixing of the metal oxide mentioned above improves the adhesiveness to the ceramic substrate is unclear, but would be based on the following: The surface of the metal particles or the surface of the ceramic substrate comprising a non-oxide is slightly oxidized so that oxidized films are formed thereon. The oxidized films are sintered to integrate through a metal oxide, and as a result, the metal particles are adhered firmly to the ceramic. Alternatively, when the ceramic constituting the ceramic substrate is an oxide, the surface is naturally formed of the oxide and, therefore, a conductor layer with excellent adhesiveness is formed.

Preferred examples of the metal oxide mentioned above include at least one selected from the group consisting of lead oxide, zinc oxide, silica, boron oxide ($B_2O_3$), alumina, yttria, and titania.

These oxides make it possible to improve adhesiveness between the metal particles and the ceramic substrate without increasing the resistance value of the resistance heating elements.

When the total amount of the metal oxides is set to 100 parts by weight, the weight ratios of the above-mentioned lead oxide, zinc oxide, silica, boron oxide ($B_2O_3$), alumina, yttria and titania are as follows: lead oxide: 1 to 10, silica: 1 to 30, boron oxide: 5 to 50, zinc oxide: 20 to 70, alumina: 1 to 10, yttria: 1 to 50 and titania: 1 to 50. The weight ratios are preferably adjusted within the range that the total thereof does not exceed 100 parts by weight.

By adjusting the amounts of these oxides within those ranges, the adhesiveness to the ceramic substrate can be particularly improved.

The addition amount of the metal oxides mentioned above to the metal particles is preferably 0.1% by weight or more and less than 10% by weight. The area resistivity achieved when the conductor containing paste having such a composition is used to form the resistance heating elements is preferably from 1 to 45 mΩ/□.

This is because if the area resistivity exceeds 45 mΩ/□, the calorific value for the applied voltage becomes too large so that, in the ceramic substrate for a semiconductor device wherein a resistance heating element is set on its surface, its calorific value generated is not easily controlled. If the addition amount of the metal oxides is 10% by weight or more, the area resistivity exceeds 50 mΩ/□ so that the calorific value generated becomes too large. Thus, temperature-control is not easily performed so that the evenness in temperature distribution is deteriorated.

In case that the resistance heating elements are formed on the surface of the ceramic substrate, a metal covering layer is preferably formed on the surface of the resistance heating elements. This is because the metal covering layer prevents a change in the resistance value owing to the oxidization of the internal metal sintered body. The thickness of the metal covering layer to be formed is preferably from 0.1 to 10 μm.

The metal to be used for forming the metal covering layer mentioned above is not particularly limited if the metal is a metal which is hardly oxidized. Specific examples thereof include gold, silver, palladium, platinum, nickel and the like. These may be used alone or in combination of two or more. Among these metals, nickel is preferred.

In case that the resistance heating elements are formed inside the ceramic substrate, no coating is necessary since the surface of the resistance heating elements is never oxidized.

When a conductor is formed on the surface of the ceramic substrate of the present invention and inside the ceramic substrate, and the conductor layer set on the surface is a chuck top conductor layer, and the internal conductor is at least one of a guard electrode and a ground electrode, the above-mentioned ceramic substrate functions as a wafer prober.

Figure 12:
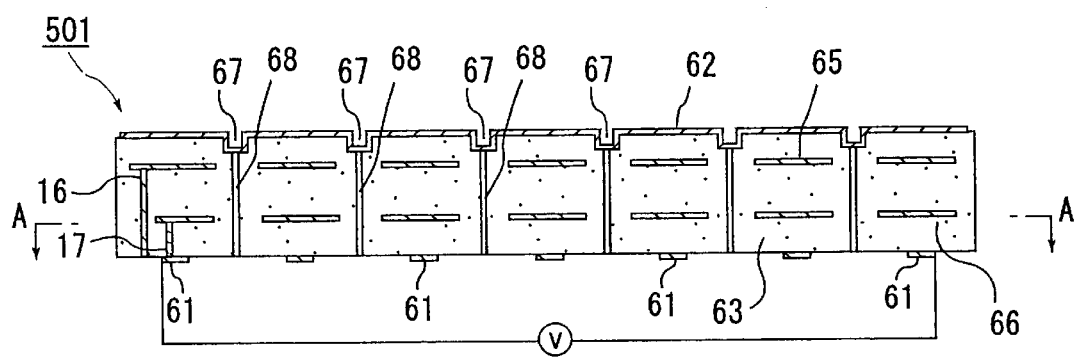
FIG. 12 is a sectional view that schematically illustrates a wafer prober using a ceramic substrate of the present invention.
Figure 13:
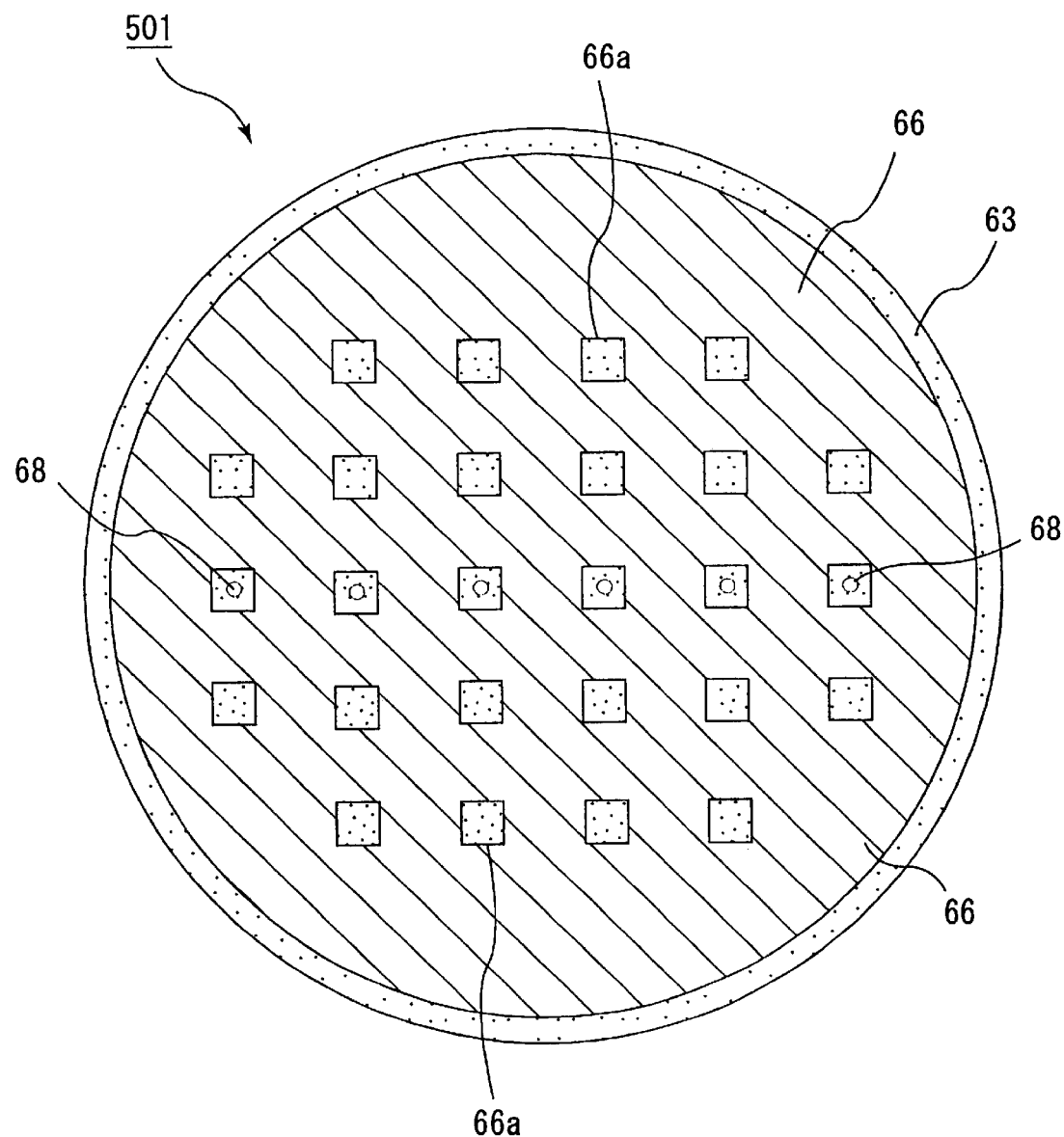
FIG. 13 is a sectional view that schematically illustrates a ground electrode of the wafer prober illustrated in FIG. 12.

FIG. 12 is a sectional view schematically illustrating one embodiment of the wafer prober according to the present invention. FIG. 13 is a sectional view of the wafer prober illustrated in FIG. 12 taken along the A—A line.

In this wafer prober 501, grooves 67 in a concentric configuration as viewed from the above are formed in the surface of a ceramic substrate 63 in a disc-shape and a plurality of suction holes 68 for sucking a silicon wafer are provided in a part of the grooves 67. A chuck top conductor layer 62 for connecting to an electrode of a silicon wafer is formed, in a circular form, in the most part of the ceramic substrate 63 including the grooves 67.

On the other hand, on the bottom face of the ceramic substrate 63, heating elements 61 in a concentric configuration as viewed from the above as shown in FIG. 1 are disposed in order to control the temperature of a silicon wafer. To both ends of each of the heating elements 61, external terminal (not shown) are connected and fixed. Moreover, a guard electrode 65 and a ground electrode 66 (reference to FIG. 13), both being in a lattice form as viewed from the above, are arranged inside the ceramic substrate 63 in order to remove a stray capacitor and noise. The materials of the guard electrode 65 and the ground electrode 66 may be the same as those of the electrostatic electrodes.

The thickness of the above-mentioned chuck top conductor layer 62 is desirably 1 to 20 μm because if it is less than 1 μm, the resistance value is too high to work as an electrode and, on the other hand, if it exceeds 20 μm, the layer becomes easy to exfoliate due to the stress that the conductor has.

As the chuck top conductor layer 62, at least one kind of metal selected from high-melting point metals such as copper, titanium, chromium, nickel, noble metals (gold, silver, platinum and the like), tungsten and molybdenum can be employed.

As for a wafer prober having such a structure, a continuity test can be performed by placing, on the wafer prober, a silicon wafer having an integrated circuit formed thereon, pressing a probe card having a tester pin against the silicon wafer and applying a voltage while heating and cooling.

Since the ceramic substrate constituting this wafer prober has a dispersion of the thickness of the conductor layer constituting the guard electrodes or the ground electrodes to the average thickness of the conductor layer thereof being within the range of −70 to +150%, the local dispersion of the applied voltage of the guard electrodes or the ground electrodes is eliminated, resulting in the certain removal of a stray capacitor and noise.

In the production of the above-mentioned wafer prober, for example, a ceramic substrate having a guard electrode or a ground electrode embedded therein is produced first, followed by the formation of resistance heating elements on the bottom face of the ceramic substrate. Thereafter, grooves are formed in the top face of the ceramic substrate and subsequently the surface portion having the grooves therein is subjected to sputtering, plating and so on, to form a metal layer.

Best Mode for Carrying out the Invention

The present invention will be described in more detail hereinafter by referring to Examples.

EXAMPLE 1

Production of an Electrostatic Chuck (Reference to FIG. 8)
(1) A green sheet 0.47 mm in average thickness was obtained by conducting formation by the doctor blade method and then drying, using a paste with a viscosity of $10^4$ cP obtained by mixing 1000 parts by weight of aluminum nitride powder fired in the air at 500° C. (made by Tokuyama Corporation, average particle diameter: 1.1 μm), 40 parts by weight of yttria (average particle diameter: 0.4 μm), 115 parts by weight of an acrylic binder, 5 part by weight of a dispersant and 530 parts by weight of alcohol containing 1-butanol and ethanol. The dispersion of the thickness of the green sheet and the drying conditions are provided in Table 1.
(2) Next, the following portions were formed by punching: portions which would become through holes through which semiconductor wafer supporting pins having, respectively, diameters of 1.8 mm, 3.0 mm and 5.0 mm were inserted; and portions which would become conductor-filled through holes for connecting external terminals.
(3) A conductor containing paste A was prepared by mixing 100 parts by weight of tungsten carbide particles having an average particle diameter of 1 μm, 3.0 parts by weight of an acrylic resin binder, 3.5 parts by weight of α-terpineol solvent and 0.3 part by weight of a dispersant.

A conductor containing paste B was prepared by mixing 100 parts by weight of tungsten particles having an average particle diameter of 3 μm, 1.9 parts by weight of an acrylic resin binder, 3.7 parts by weight of α-terpineol solvent and 0.2 part by weight of a dispersant.

This conductor containing paste A was printed on the green sheet by screen printing to form a conductor containing paste layer for a resistance heating element. The pattern of the printing was made into a concentric pattern, and the width and the thickness thereof were set to 10 mm and 12 µm, respectively. Furthermore, conductor containing paste layers of an electrostatic electrode pattern shown in FIG. 4 were formed on other green sheets. These conductor containing paste layers had a thickness of 10 µm.

Moreover, the conductor containing paste B was filled into the through holes for the formation of conductor-filled through holes for connecting external terminals.

On the green sheet 50 that had been subjected to the above-mentioned processing, thirty four green sheets 50' having no tungsten paste printed were stacked on (on the wafer treating face) the green sheet 50, and thirteen sheets of the same green sheets 50' were stacked under the green sheet 50. Moreover, a green sheet 50 having a printed conductor containing paste layer of an electrostatic electrode pattern was stacked thereon. Furthermore, two green sheets 50' having no tungsten paste printed were stacked thereon. The resultant was pressed at 130° C. and a pressure of 8 MPa (80 kg/cm²) to form a lamination (FIG. 8(a)).

(4) Next, the resultant lamination was degreased at 600° C. in the atmosphere of nitrogen gas for 5 hours and hot-pressed at 1890° C. and a pressure of 15 MPa (150 kg/cm²) for 3 hours to obtain an aluminum nitride plate 3 mm in thickness. This was cut into a disc of 230 mm in diameter to form a plate made of aluminum nitride that had a resistance heating elements 5 having a thickness of 6 µm and a width of 10 mm, a chuck positive electrostatic layer 2 having a thickness of 10 µm, and a chuck negative electrostatic layer 3 having a thickness of 10 µm inside thereof (FIG. 8 (b))

(5) Next, the plate obtained in the step of (4) was ground with a diamond grindstone. Subsequently a mask was put thereon, and bottomed holes (diameter: 1.2 mm, depth: 2.0 mm) for fitting thermocouples were formed in the surface by blast treatment with SiC and the like.

(6) Furthermore, portions where the conductor-filled through holes were formed were hollowed out to form blind holes 35, 36 (FIG. 8 (c)). To the blind holes 35, 36, external terminals 6, 18 made of Koval were connected by heating to reflow at 700° C. using brazing gold comprising Ni—Au (FIG. 8(d)).

As for the connection of the external terminals, a structure wherein a support of tungsten supports at three points is desirable. This is because the reliability of the connection can be secured.

(7) Next, thermocouples for controlling temperature were buried in the bottomed holes to finish the production of an electrostatic chuck having the resistance heating elements.

EXAMPLES 2 and 3
Production of an Electrostatic Chuck

Electrostatic chucks were produced in the same manner as Example 1 except that the drying conditions of a green sheet and the dispersion of thickness of the green sheet were set as shown in Table 1.

Comparative Examples 1, 2

Electrostatic chucks were produced in the same manner as Example 1 except that the drying conditions of a green sheet and the dispersion of thickness of the green sheet were set as shown in Table 1.

Comparative Examples 3, 4

Electrostatic chucks were produced in the same manner as Example 1 except that the thickness of the ceramic substrate was set to 1.5 mm, the thickness of the conductor layer was set to 150 µm and the drying conditions of a green sheet were set as shown in Table 1.

Silicon wafers 9 were put on the thus produced electrostatic chucks according to Examples 1 to 3 and Comparative Examples 1 to 4, and then were allowed to be adsorbed to the electrostatic chucks. Subsequently, an electric current was passed to rise the temperature of the ceramic substrates so that the temperature of the ceramic substrates was made to 450° C. Thereafter, for each ceramic substrate, the temperature of each portion of the surface of the silicon wafer was measured with a thermoviewer (IR62012-0012, manufactured by Japan Datum Co., Ltd.). Thus, the difference between the lowest temperature and the highest temperature was calculated. The results are given in Table 1.

Moreover, a silicon wafer was divided into twelve regions and then placed on a electrostatic chuck. The temperature was elevated to 400° C. and a voltage of 1 kV was applied, followed by the measurement of chuck power in each region with a load cell (Autograph AGS-50, manufactured by Shimadzu Corp.) Thus, the difference between the maximum value and the minimum value was calculated.

As for the dispersion of thickness of a green sheet, the thickness was measured at optional ten points with a micrometer and then the average of the measurements was calculated. Of the measurements, the measurement farthest from the average was defined as the amount of dispersion (%)

That is, the amount of dispersion of thickness is represented by the following formula (1):

$$\text{The amount of dispersion of thickness of a green sheet (\%)} = [(\text{the maximum value or the minimum value of the measurements of thickness} - \text{average of thickness}) \times 100]/\text{average of thickness} \quad (1)$$

As a crack test, a test, wherein the above-mentioned electrostatic chuck was heated to 400° C. in 45 seconds and then whether cracks generated or not was checked, was conducted.

The warp amount was measured with a shape-measuring device (tradename: Nanoway, manufactured by Kyocera Corporation) after heating to 400° C. and then cooling to room temperature.

Moreover, each of these ceramic substrates according to Examples and Comparative Examples was cut along its longitudinal direction at five points. Each of the exposed electrostatic electrodes was observed with a scanning electron microscope (SEM) at ten points to measure the thickness. The maximum value (or the minimum) against the average of the measured thicknesses was defined as the amount of dispersion. Since the measuring method of the dispersion of the thickness of a resistance heating element is exactly the same, the amount of dispersion of the thickness of a conductor layer is represented here by the following formula (2):

$$\text{The amount of dispersion of thickness of conductor layer (\%)} = [(\text{the maximum value or the minimum value of the measurements of thickness} - \text{average of thickness}) \times 100]/\text{average of thickness} \quad (2)$$

TABLE 1

|  | Drying condition | Drying of green sheet Dispersion of thickness (%) | $t_2/t_1$ | Difference in chuck power (g/cm²) | Temperature difference in a silicon wafer surface (° C.) | Temperature difference on a heating face (° C.) | Crack | Warp |
|---|---|---|---|---|---|---|---|---|
| Example 1 | 60° C., 15 minutes<br>100° C., 15 minutes | +20 | 0.002<br>0.003 | 20 | 6 | 4 | None | 5 µm or less |
| Example 2 | 80° C., 20 minutes<br>150° C., 20 minutes | +130 | 0.002<br>0.003 | 30 | 7 | 4 | None | 5 µm or less |
| Example 3 | 100° C., 20 minutes<br>150° C., 20 minutes | −50 | 0.002<br>0.003 | 30 | 7 | 4 | None | 5 µm or less |
| Comparative Example 1 | 200° C., 20 minutes<br>200° C., 20 minutes | +155 | 0.002<br>0.003 | 50 | 18 | 15 | Observed | 15 µm |
| Comparative Example 2 | 160° C., 20 minutes<br>160° C., 20 minutes | −75 | 0.002<br>0.003 | 50 | 18 | 15 | Observed | 15 µm |
| Comparative Example 3 | 80° C., 20 minutes<br>150° C., 20 minutes | +125 | 0.1<br>0.1 | 45 | 15 | 13 | Observed | 15 µm |
| Comparative Example 4 | 100° C., 20 minutes<br>150° C., 20 minutes | −40 | 0.1<br>0.1 | 45 | 15 | 13 | Observed | 15 µm |

Figure 14:
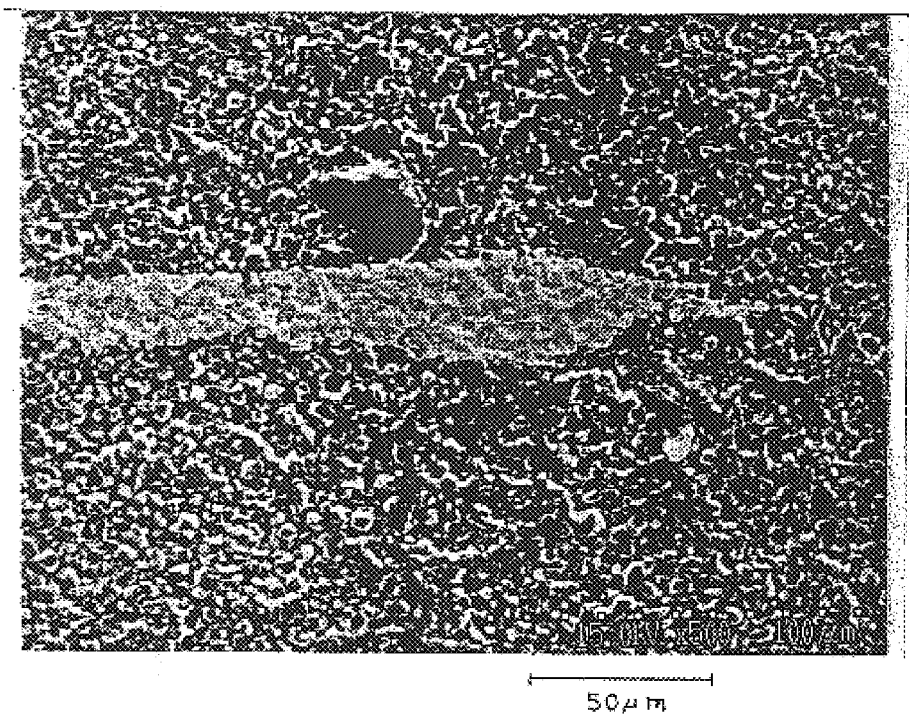
FIG. 14 is a scanning electron microscope photograph that shows an electrostatic electrode formed inside a ceramic substrate of the present invention.
Figure 15:
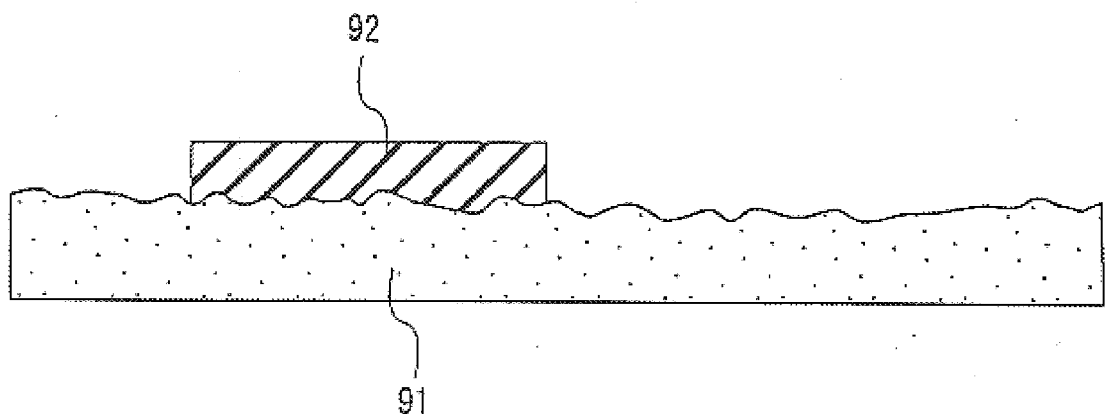
FIG. 15 is a sectional view that schematically illustrates a conductor containing paste layer formed on a green sheet prepared in the conventional manufacturing process of a ceramic substrate.

FIG. 14 is a scanning electron microscope photograph that shows a section of the ceramic substrate constituting the electrostatic chuck of Example 1 including an electrostatic electrode. As shown in FIG. 14, even if there is some dispersion of thickness of the electrostatic electrode, cracks and warp are effectively prevented and there is no dispersion of chuck power.

As is clear from the results shown in Table 1, in the cases of Examples 1 to 3, in which $t_2/t_1$ is less than 0.1 and the dispersion of thickness of a conductor layer is in the range of −70 to +150%, the ceramic substrates exhibited extremely small warp, there was no crack and the temperature of the wafer treating faces was even. Furthermore, as for chuck power, relatively small dispersions were observed.

EXAMPLE 4
Production of a Ceramic Heater (reference to FIG. 1)
(1) Granular powder was prepared by spray-drying a composition obtained by mixing 100 parts by weight of aluminum nitride powder (made by Tokuyama Corporation, average particle diameter: 0.6 µm), 4 parts by weight of yttria (Y₂O₃, average particle diameter: 0.4 µm), 12 parts by weight of an acrylic binder and 53 parts by weight of an alcohol comprising 1-butanol and ethanol.
(2) Next, the granular powder was put into a mold and formed into a flat plate form. Thus, a raw formed body (green) was obtained.
(3) The raw formed body subjected to the processing was hot-pressed at a temperature of 1800° C. and a pressure of 20 MPa (200 kg/cm²) to obtain a aluminum nitride plate body having a thickness of 3 mm.
Next, this plate was cut into a disc having a diameter of 210 mm to produce a plate body made of a ceramic (a ceramic substrate).
A glass paste was applied to the bottom face of the ceramic substrate. Thereafter, the plate was dried and fired to form a SiO₂ film having a thickness of 2 µm.
Next, this plate body was drilled and processed with a cutting tool to form: through holes into which lifter pins would be inserted; through holes into which supporting pins for supporting a silicon wafer would be inserted; and bottomed holes 14 (diameter: 1.1 mm, depth: 2 mm) in which thermocouples would be buried.
(4) Next, a conductor containing paste was printed by screen printing on the bottom face of the sintered body obtained in the step (3). The pattern of the printing was made to a pattern of concentric circles-like as shown in FIG. 1.

As the conductor containing paste, a paste having the following composition was used.

Namely, the conductor containing paste was comprising 50 parts by weight of scaly silver (Ag-540, made by Showa Chemical Industry Co., Ltd.), 10 parts by weight of zinc oxide, 8 parts by weight of silica, 2 parts by weight of boron oxide and 30 parts by weight of cellulose acetate, which is an organic vehicle.
(5) Next, the substrate having the conductor containing paste printed was heated and fired at 780° C. to sinter the silver in the conductor containing paste and bake them onto the substrate. Thus, resistance heating elements were formed. The resistance heating elements mainly containing silver had a thickness of 5 µm, a width of 15 mm and an area resistivity of 5.09 Ω/□.
(6) The ceramic substrate prepared in the step (5) was immersed into an electroless nickel plating bath comprising an aqueous solution containing 80 g/L of nickel sulfate, 24 g/L of sodium hypophosphite, 12 g/L of sodium acetate, 8 g/L of boric acid and 6 g/L of ammonium chloride to precipitate a metal covering layer (nickel layer) having a thickness of 1 µm on the surface of the resistance heating element mainly containing silver.
(7) A silver-lead solder paste (made by Tanaka Kikinzoku Kogyo Co.) was printed by screen printing to form a solder layer on the terminal portions for securing the connection to a power source.
Next, external terminals made of Koval were put on the solder layer and were attached to the terminal portions of the resistance heating element by heating to reflow at 420° C.
(8) Thermocouples for controlling temperature were inserted into the bottomed holes and a polyimide resin was filled therein. The resin was allowed to cure at 190° C. for 2 hours to obtain a ceramic heater having resistance heating elements on its bottom face.

EXAMPLE 5

A ceramic heater was produced in the same manner as Example 4 except for using a paste having the following composition as a conductor containing paste.

Namely, the conductor containing paste was comprising 50 parts by weight of scaly silver (Ag-540, made by Showa Chemical Industry Co., Ltd.), 50 parts by weight of spherical palladium (Pd-225, made by Showa Chemical Industry Co., Ltd.), 10 parts by weight of zinc oxide, 8 parts by weight of silica, 2 parts by weight of boron oxide and 30 parts by weight of cellulose acetate, which is an organic vehicle.

between the lowest temperature and the highest temperature was obtained. At the same time, crack and warp of the ceramic substrate were checked in the same manner as Examples 1 to 3. The results are given in Table 2.

TABLE 2

|  | Shape of particles in a conductor containing paste | Dispersion of thickness of a green sheet (%) | $t_2/t_1$ | Temperature difference on a heating face (° C.) | Crack | Warp |
|---|---|---|---|---|---|---|
| Example 4 | Only scaly | +10 | 0.002 | 5 | None | 5 μm or less |
| Example 5 | Scaly + Spherical | −10 | 0.002 | 5 | None | 5 μm or less |
| Comparative Example 5 | Spherical | +152 | 0.002 | 15 | Observed | 15 μm |
| Comparative Example 6 | Spherical + Spherical | −73 | 0.002 | 15 | Observed | 15 μm |
| Comparative Example 7 | Only scaly | +10 | 0.1 | 13 | Observed | 15 μm |
| Comparative Example 8 | Scaly + Spherical | −10 | 0.1 | 13 | Observed | 15 μm |

Comparative Example 5

A ceramic heater was produced in the same manner as Example 4 except for using a paste having the following composition as a conductor containing paste.

Namely, the conductor containing paste was comprising 100 parts by weight of spherical silver particles (Ag-520, made by Showa Chemical Industry Co., Ltd.), 10 parts by weight of zinc oxide, 8 parts by weight of silica, 2 parts by weight of boron oxide and 30 parts by weight of cellulose acetate, which is an organic vehicle.

Comparative Example 6

A ceramic heater was produced in the same manner as Example 4 except for using a paste having the following composition as a conductor containing paste.

Namely, the conductor containing paste was comprising 50 parts by weight of spherical silver particles (Ag-520, made by Showa Chemical Industry Co., Ltd.), 50 parts by weight of spherical palladium (Pd-225, made by Showa Chemical Industry Co., Ltd.), 10 parts by weight of zinc oxide, 8 parts by weight of silica, 2 parts by weight of boron oxide and 30 parts by weight of cellulose acetate, which is an organic vehicle.

Comparative Examples 7, 8

Two ceramic heaters were produced in the same manners as Example 4 and Example 5, respectively, except for setting the thickness of a ceramic substrate to 1.5 mm and setting the thickness of a resistance heating element to 150 μm.

An electric current was passed to each of the thus produced ceramic heaters according to Examples 4, 5 and Comparative Examples 5 to 8. For each ceramic heater, a silicon wafer was put on the wafer treating face of the ceramic substrate and was heated with maintaining the temperature of the wafer treating face at 450° C. The temperature of each portion of the wafer treating face was measured with a thermoviewer (IR62012-0012, manufactured by Japan Datum Co., Ltd.). Thus, the difference As a result, as shown in the above Table 2, the temperature difference in a wafer treating face was as small as 5° C. in Examples 4 and 5. Conversely, in Comparative Examples 5 to 8, it was as large as 13 to 15° C.

Test Example 1

An electrostatic chuck was produced in the same manner as Comparative Example 1 except for setting the diameter of the ceramic substrate constituting the electrostatic chuck to 150 mm.

Thereafter, the electrostatic chuck was heated to 400° C. and a voltage of 1 kV was applied. Subsequently, the difference between the highest and lowest temperatures of the surface of the silicon wafer was measured. As the result, the temperature difference was 9° C.

Test Example 2

A ceramic heater was produced in the same manner as in the Comparative Example 2 except for setting the diameter of the ceramic substrate constituting the ceramic heater to 150 mm.

After heating to 400° C., the difference between the highest and lowest temperatures of the surface of the silicon wafer was measured. As the result, the temperature difference was 7° C.

As is clear from these results, the present invention exhibits a remarkable effect when a ceramic substrate has a diameter exceeding 150 mm.

EXAMPLE 6

Production of a Wafer Prober (1) A green sheet of 0.47 mm in thickness with a surface roughness in the value of Rmax of 50 μm was obtained by forming, by the doctor blade method, a mixed composition prepared by mixing 1000 parts by weight of aluminum nitride powder (made by Tokuyama Corporation, average particle diameter: 1.1 μm), 40 parts by weight of yttria (average particle diameter: 0.4 μm) and 530 parts by weight of an alcohol comprising 1-butanol and ethanol.

(2) Subsequently, after drying this green sheet at 80° C. for 5 hours, through holes for the formation of a conductor-filled through hole for connecting a resistance heating element to an external terminal pin were formed by punching.

(3) A conductor containing paste A was prepared by mixing 100 parts by weight of tungsten carbide particles having an average particle diameter of 1 μm, 3.0 parts by weight of an acrylic binder, 3.5 parts by weight of α-terpineol solvent and 0.3 part by weight of a dispersant.

A conductor containing paste B was prepared by mixing 100 parts by weight of tungsten particle having an average particle diameter of 3 μm, 1.9 parts by weight of an acrylic binder, 3.7 parts by weight of α-terpineol solvent and 0.2 part by weight of a dispersant.

Subsequently, to the green sheet which were printed with a printed element in a lattice-shape for a guard electrode and a printed element in a lattice-shape for a ground electrode by screen printing using this conductor containing paste A.

The conductor containing paste B was filled in the through hole for the formation of a conductor-filled through hole for being connected with a terminal pin.

Moreover, the green sheet with printed element and fifty green sheets with no printed element, the number of those is 50, were stacked and integrated at 130° C. at a pressure of 8 MPa (80 kg/cm$^2$) to obtain a lamination.

(4) Next, an aluminum nitride plate body 3 mm in thickness was obtained by degreasing this lamination in a nitrogen gas at 600° C. for 5 hours and hot pressing it at 1890° C. at a pressure of 15 MPa (150 kg/cm$^2$) for 3 hours. The resulting plate body was cut into a disc-shape of 300 mm in diameter to form a plate body of ceramic. The size of the conductor-filled through hole 17 was 0.2 mm in diameter and 0.2 mm in depth.

Furthermore, both a guard electrode and a ground electrode had a thickness of 10 μm. The position where the guard electrode was formed was 1 mm a part from the wafer putting face and the position where the ground electrode was formed was 1.2 mm a part from the wafer putting face. The length of one side of the non-conductor formed areas in the guard electrode and the ground electrode was 0.5 mm.

(5) After grinding of the plate body obtained in the step (4) with a diamond grindstone, a mask was placed on the plate body and a concave portion for fitting a thermocouple and a groove for wafer adsorption (width: 0.5 mm, depth: 0.5 mm) were formed in the surface by blast treatment with SiC and the like.

(6) Furthermore, a layer for forming a resistance heating element was printed on the face opposing the wafer putting face. For the printing, a conductor containing paste was used. The conductor containing paste used was Solbest PS603D manufactured by Tokuriki Kagaku Kenkyusyo, Co., which has been used for the formation of plated through holes in printed circuit boards. This conductor containing paste is a silver/lead paste and contains 7.5 parts by weight, per 100 parts by weight of silver, of metal oxides comprising lead oxide, zinc oxide, silica, boron oxide and alumina (the weight ratio thereof being 5/55/10/25/5).

The silver had a scaly shape having an average particle diameter of 4.5 μm.

(7) Next, the silver and the lead in the conductor containing paste were sintered and baked onto the ceramic substrate by heating and firing the ceramic substrate printed with the conductor containing paste at 780° C. Subsequently, a nickel layer 1 μm in thickness containing 1% by weight or less of boron was precipitated on the surface of the resistance heating element 61 comprising the silver sintered body by immersing the heater plate in an electroless nickel plating bath comprising an aqueous solution containing 30 g/L of nickel sulfate, 30 g/L of boric acid, 30 g/L of ammonium chloride and 60 g/L of Rochelle salt.

The heater plate was, then, subjected to annealing treatment at 120° C. for 3 hours.

The resistance heating element comprising the silver sintered body was 5 μm in thickness and 2.4 mm in width and had an area resistivity of 7.7 mΩ/□.

(8) On the face with a groove, a titanium layer, a molybdenum layer and a nickel layer were formed sequentially by a sputtering method. The equipment used for the sputtering was SV-4540 manufactured by ULVAC JAPAN LTD. The sputtering conditions were as follows; the pressure: 0.6 Pa, the temperature: 100° C. and the electric power: 200 W. The sputtering time was adjusted in the range of 30 seconds to one minute for each metal.

An image detected with a fluorescent X-ray analyzer showed that the thicknesses of the resulting films were 0.3 μm for the titanium layer, 2 μm for the molybdenum layer and 1 μm for the nickel layer.

(9) A nickel layer of 7 μm in thickness containing 1% by weight or less of boron was precipitated on the surface of the metal layer formed by the sputtering, by immersing the ceramic substrate 63 obtained in the step (8) in an electroless nickel plating bath comprising an aqueous solution containing 30 g/L of nickel sulfate, 30 g/L of boric acid, 30 g/L of ammonium chloride and 60 g/L of Rochelle salt. The resulting ceramic substrate was subjected to annealing treatment at 120° C. for 3 hours.

The surface of the resistance heating element allows no electric current to flow, so the surface thereof was not covered with any electrolytic nickel plating.

Furthermore, a gold plating layer of 1 μm in thickness was precipitated on the nickel plating layer by immersing the surface thereof in an electroless gold plating solution containing 2 g/L of potassium gold cyanide, 75 g/L of ammonium chloride, 50 g/L of sodium citrate and 10 g/L of sodium hypophosphite under the condition of 93° C. for one minute.

(10) An air suction hole extending from the groove to the back face was formed by drill processing and further a blind hole (not shown) for exposing a conductor-filled through hole was formed. To this blind hole, an external terminal pin made of Koval was connected using a gold solder comprising Ni—Au alloy (Au 81.5% by weight, Ni 18.4% by weight, impurities 0.1% by weight) by heating to reflow at 970° C. Moreover, an external terminal pin made of Koval was formed on the resistance heating element through a solder (tin 90% by weight/lead 10% by weight).

(11) Subsequently, a plurality of thermocouples for temperature control were buried in the concave portions, thus, a wafer prober heater was obtained.

Comparative Example 9

A wafer prober was produced in the same manner as Example 6 except for producing a green sheet having a surface roughness of 210 μm in the value of Rmax.

In the wafer prober according to Example 6, the guard electrode and the ground electrode had dispersions of thickness as small as +20% and −15%, respectively. Conversely, as for the wafer prober according to Comparative Example 9, the guard electrode and the ground electrode had dispersions of thickness as large as +155% and −75%, respectively.

Furthermore, silicon wafers that have already been found to be acceptable products were placed on the chuck top conductor layers of the wafer probers according to Example 6 and Comparative Example 9, and their temperature was raised up to 180° C. Thereafter, a continuity test was conducted using a probe card. Consequently, the result that the silicon wafer is an acceptable product was obtained for the wafer prober according to Example 6. On the other hand, the result that the silicon wafer is a defective was obtained for the wafer prober according to Comparative Example 9.

The wrong result was caused probably by the fact that stray capacitor or noise was not eliminated due to the dispersion of the thickness of the ground electrode or guard electrode.

INDUSTRIAL APPLICABILITY

As described above, the ceramic substrate of the present invention does not cause problem of cracks or warp of the ceramic substrate even if rapid temperature rising or rapid temperature falling is performed.

Moreover, when it is used as a hot plate (a ceramic heater) a small dispersion of temperature of a wafer treating face is generated. When it is used as an electrostatic chuck, a dispersion of chuck power is small. When it is used as a wafer prober, little noise is caused and a precise continuity test can be realized.

What is claimed is:

1. A ceramic substrate provided with a conductor layer on the surface of said ceramic substrate or inside said ceramic substrate,
   wherein: the ratio ($t_2/t_1$) of the average thickness of said conductor layer ($t_2$) to the average thickness of said ceramic substrate ($t_1$) is less than 0.1; and a dispersion of the thickness of the conductor layer to the average thickness of the conductor layer is in a range of −70 to +150%.

2. The ceramic substrate according to claim 1, wherein said ceramic substrate is in a disc-shape with a diameter exceeding 150 mm.

3. The ceramic substrate according to claim 1, wherein the thickness of said ceramic substrate is 25 mm or less.

4. The ceramic substrate according to claim 1, wherein said conductor layer is an electrostatic electrode.

5. The ceramic substrate according to claim 1, wherein said conductor layer is a resistance heating element.

6. The ceramic substrate according to claim 1, wherein said conductor layer is any of a chuck top electrode, a guard electrode and a ground electrode.

7. The ceramic substrate according to claim 2, wherein the thickness of said ceramic substrate is 25 mm or less.

8. The ceramic substrate according to claim 2, wherein said conductor layer is an electrostatic electrode.

9. The ceramic substrate according to claim 3, wherein said conductor layer is an electrostatic electrode.

10. The ceramic substrate according to claim 7, wherein said conductor layer is an electrostatic electrode.

11. The ceramic substrate according to claim 2, wherein said conductor layer is a resistance heating element.

12. The ceramic substrate according to claim 3, wherein said conductor layer is a resistance heating element.

13. The ceramic substrate according to claim 7, wherein said conductor layer is a resistance heating element.

14. The ceramic substrate according to claim 2, wherein said conductor layer is any of a chuck top electrode, a guard electrode and a ground electrode.

15. The ceramic substrate according to claim 3, wherein said conductor layer is any of a chuck top electrode, a guard electrode and a ground electrode.

16. The ceramic substrate according to claim 7, wherein said conductor layer is any of a chuck top electrode, a guard electrode and a ground electrode.

* * * * *